United States Patent
Xie et al.

(10) Patent No.: US 12,494,428 B2
(45) Date of Patent: Dec. 9, 2025

(54) AIRGAP SPACER FOR POWER VIA

(71) Applicant: International Business Machines Corporation, Armonk, NY (US)

(72) Inventors: Ruilong Xie, Niskayuna, NY (US); Lawrence A. Clevenger, Saratoga Springs, NY (US); Nicholas Anthony Lanzillo, Wynantskill, NY (US); Kisik Choi, Watervliet, NY (US); Huai Huang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 506 days.

(21) Appl. No.: 18/054,991

(22) Filed: Nov. 14, 2022

(65) Prior Publication Data

US 2024/0162152 A1    May 16, 2024

(51) Int. Cl.
| | |
|---|---|
| H01L 23/528 | (2006.01) |
| H01L 21/768 | (2006.01) |
| H10D 30/67 | (2025.01) |
| H10D 62/10 | (2025.01) |
| H10D 84/01 | (2025.01) |
| H10D 84/83 | (2025.01) |

(52) U.S. Cl.
CPC ...... H01L 23/5286 (2013.01); H01L 21/7682 (2013.01); H10D 30/6729 (2025.01); H10D 62/121 (2025.01); H10D 84/0149 (2025.01); H10D 84/83 (2025.01)

(58) Field of Classification Search
CPC .......... H10D 30/6735; H10D 30/6729; H10D 84/0149; H10D 84/83; H10D 84/0186; H01L 21/7682; H01L 23/5286; H01L 23/485; H01L 23/535
See application file for complete search history.

(56) References Cited

U.S. PATENT DOCUMENTS

| | | | |
|---|---|---|---|
| 9,570,395 B1 | 2/2017 | Sengupta et al. | |
| 9,716,158 B1 | 7/2017 | Cheng et al. | |
| 10,008,577 B2 | 6/2018 | Xie et al. | |
| 10,586,765 B2 | 3/2020 | Smith et al. | |

(Continued)

OTHER PUBLICATIONS

Gupta, A. et al. | "Buried Power Rail Integration with Si FinFETs for CMOS Scaling beyond the 5 nm Node." IEEE Xplore, 2020 Symposium on VLSI Technology Digest of Technical Papers—THL.6, Downloaded on Jan. 12, 2021, 2 pages.

(Continued)

*Primary Examiner* — Changhyun Yi
(74) *Attorney, Agent, or Firm* — Amin, Turocy & Watson, LLP

(57) ABSTRACT

One or more systems, devices and/or methods of use provided herein relate to an airgap spacer for power via. The semiconductor device can comprise a power bar wired to a backside power rail, wherein the power bar is located between a first gate of a first field effect transistor (FET) and a second gate of a second FET at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold.

17 Claims, 29 Drawing Sheets

(56) References Cited

U.S. PATENT DOCUMENTS

| | | | |
|---|---|---|---|
| 10,636,739 | B2 | 4/2020 | Beyne et al. |
| 10,700,207 | B2 | 6/2020 | Chen et al. |
| 10,872,820 | B2 | 12/2020 | Block et al. |
| 11,404,548 | B2 | 8/2022 | Yu et al. |
| 2010/0102363 | A1 | 4/2010 | Hause et al. |
| 2018/0033863 | A1 | 2/2018 | Xie et al. |
| 2020/0035560 | A1 | 1/2020 | Block et al. |
| 2020/0105671 | A1 | 4/2020 | Lai et al. |
| 2021/0351079 | A1 | 11/2021 | Su et al. |
| 2021/0375664 | A1* | 12/2021 | Chang ............... H01L 21/31116 |
| 2021/0375691 | A1 | 12/2021 | Chen et al. |
| 2022/0093448 | A1 | 3/2022 | Yu et al. |
| 2022/0115510 | A1 | 4/2022 | Yu et al. |
| 2022/0278196 | A1 | 9/2022 | Kuang et al. |
| 2022/0344464 | A1* | 10/2022 | Chiu ..................... H10D 30/43 |

OTHER PUBLICATIONS

Ryckaert et al. |"Extending the roadmap beyond 3nm through system scaling boosters: A case study on Buried Power Rail and Backside Power Delivery." Electron Devices Technology and Manufacturing Conference (EDTM), 2019, pp. 50-52 (3 pages).

Prasad, D. et al. | "Buried Power Rails and Back-side Power Grids: Arm® CPU Power Delivery Network Design Beyond 5nm." 019 IEEE International Electron Devices Meeting (IEDM), 2019, pp. 19.1.1-19.1.4, doi: 10.1109/IEDM19573.2019.8993617, 4 pages.

Mathur, R. et al. | "Buried Bitline for sub-5nm SRAM Design." 2020 IEEE International Electron Devices Meeting (IEDM), 2020, pp. 20.2.1-20.2.4, doi: 10.1109/IEDM13553.2020.9372042, 4 pages.

* cited by examiner

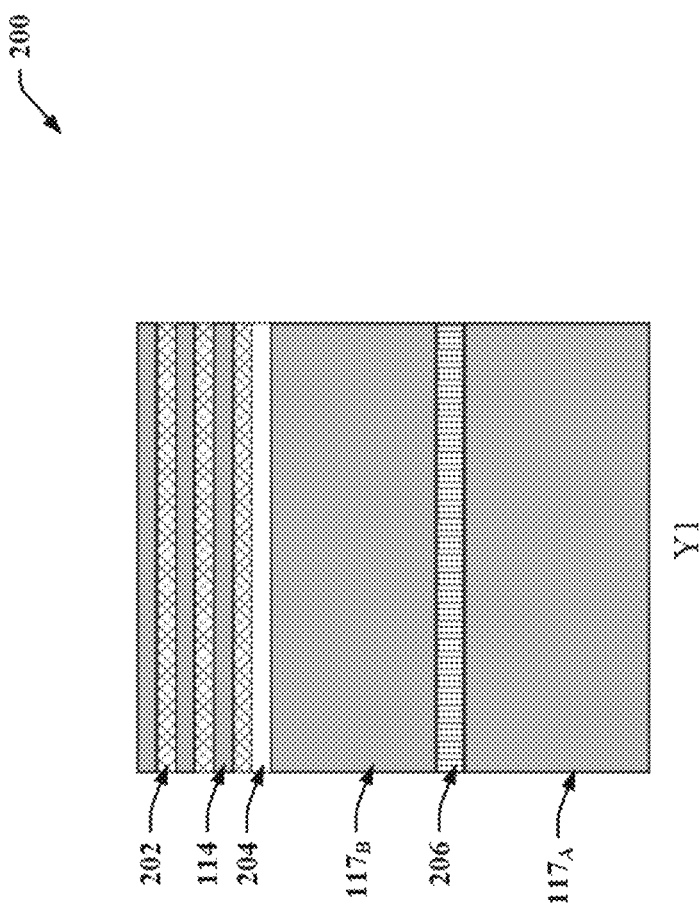

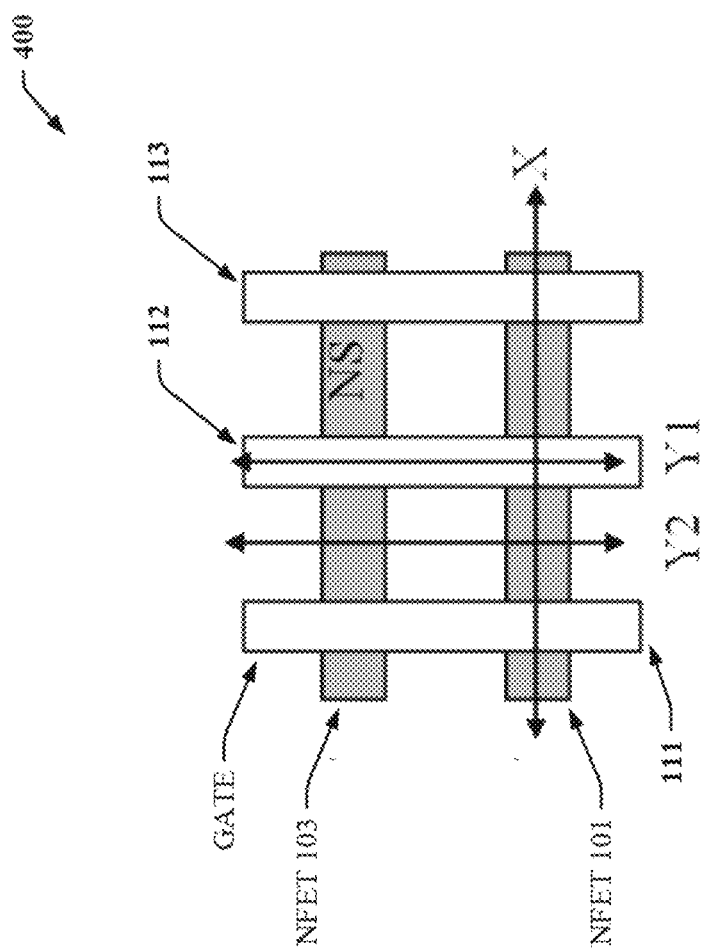

AIRGAP SPACER FOR POWER VIA

BACKGROUND

The subject disclosure relates to semiconductors and, more specifically, to forming an airgap spacer for power via.

Semiconductors are used in components of several electronic devices. As the semiconductor industry has grown, the density of devices on semiconductor chips has increased. Increasing density and decreasing spacing rules for semiconductor chips, can cause parasitic capacitance between active regions of a semiconductor device which can slow down an integrated circuit (IC) by introducing resistive-capacitive (RC) delays. With regards to some existing techniques, airgaps between a gate electrode and source/drain contacts of a semiconductor can be utilized to reduce the parasitic capacitance. However, with increasing demands of the semiconductor industry, such techniques still leave room for methods and structures that can minimize the parasitic capacitance and that can be easily implemented in the industry. Thus, systems and/or methods that can address this technical problem can be desirable.

The above-described background description is merely intended to provide a contextual overview regarding semiconductor devices and is not intended to be exhaustive.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products that enable forming an airgap in a semiconductor device are discussed.

According to an embodiment, a semiconductor device is provided. The semiconductor device can comprise a power bar wired to a backside power rail (BSPR), wherein the power bar is located between a first gate of a first field effect transistor (FET) and a second gate of a second FET. The semiconductor device can further comprise at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold. Such embodiment of the semiconductor device can provide a number of advantages, including that parasitic capacitance between the power bar and at least a first gate of the semiconductor device can be minimized.

In some embodiments, the first FET can comprise a first source region and a first drain region, wherein the first source region and the first drain region can be connected to a first contact on a frontside of the first FET, and wherein a dielectric liner is present under the first contact such that an airgap is absent under the first contact. In some embodiments, a third contact can be connected to a second source region and a second drain region of the first FET, wherein the at least the first airgap can extend between the third contact and the power bar. Such embodiment of the semiconductor device can provide a number of advantages, including wiring an FEOL source/drain (S/D) region (i.e., first source region and first drain region) to a BSPR while reducing parasitic capacitance between the power bar and at least the third contact of the semiconductor device.

According to another embodiment, a method for fabricating a semiconductor device is provided. The method can comprise wiring a power bar to a BSPR, wherein the power bar is located between a first gate of a first FET and a second gate of a second FET. The method can further comprise forming at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold. Such embodiment of the method can provide a number of advantages, including that parasitic capacitance between the power bar and at least a first gate of the semiconductor device can be minimized.

In some embodiments, the first FET can comprise a first source region and a first drain region, wherein the first source region and the first drain region can be connected to a first contact on a frontside of the first FET, and wherein a dielectric liner is present under the first contact such that an airgap is absent under the first contact. In some embodiments, a third contact can be connected to a second source region and a second drain region of the first FET, wherein the at least the first airgap can extend between the third contact and the power bar. Such embodiment of the method of fabricating a semiconductor device can provide a number of advantages, including wiring a front-end-of-line (FEOL) S/D region (i.e., first source region and first drain region) to a BSPR while reducing parasitic capacitance between the power bar and at least the third contact of the semiconductor device.

According to yet another embodiment, a method for fabricating a semiconductor device is provided. The method can comprise forming at least a first airgap between a power bar and a contact connected to a source region and a drain region of a first FET, wherein the at least the first airgap is formed by selectively recessing a dielectric liner, and wherein the at least the first airgap maintains parasitic capacitance in the semiconductor device below a threshold. Such embodiment of the method can provide a number of advantages, including that the dielectric liner can be selectively recessed such that greater advantages of reduced/minimized parasitic capacitance can be acquired depending on the level to which the dielectric liner is recessed.

In some embodiments, the at least the first airgap can extend between the power bar and at least a portion of a first gate of the first FET, and wherein the semiconductor device can comprise a second airgap between the power bar and at least a portion of a second gate of a second FET. In some embodiments, the method can comprise forming a via-to-backside power rail (VBPR) patterning to remove at least a portion of the dielectric liner and forming power bar metallization. Such embodiment of the method can provide a number of advantages, including reduction in parasitic capacitance between the power bar and gate ends of the semiconductor device and wiring an FEOL S/D region to a BSPR.

BRIEF DESCRIPTION OF THE DRAWINGS

FIG. 2 illustrates an example, non-limiting cross-sectional view of a starting substrate in accordance with one or more embodiments described herein.

FIG. 4A illustrates an example, non-limiting top view of a step comprising forming an FEOL device in a semiconductor device fabrication process in accordance with one or more embodiments described herein.

DETAILED DESCRIPTION

Figure 1A:
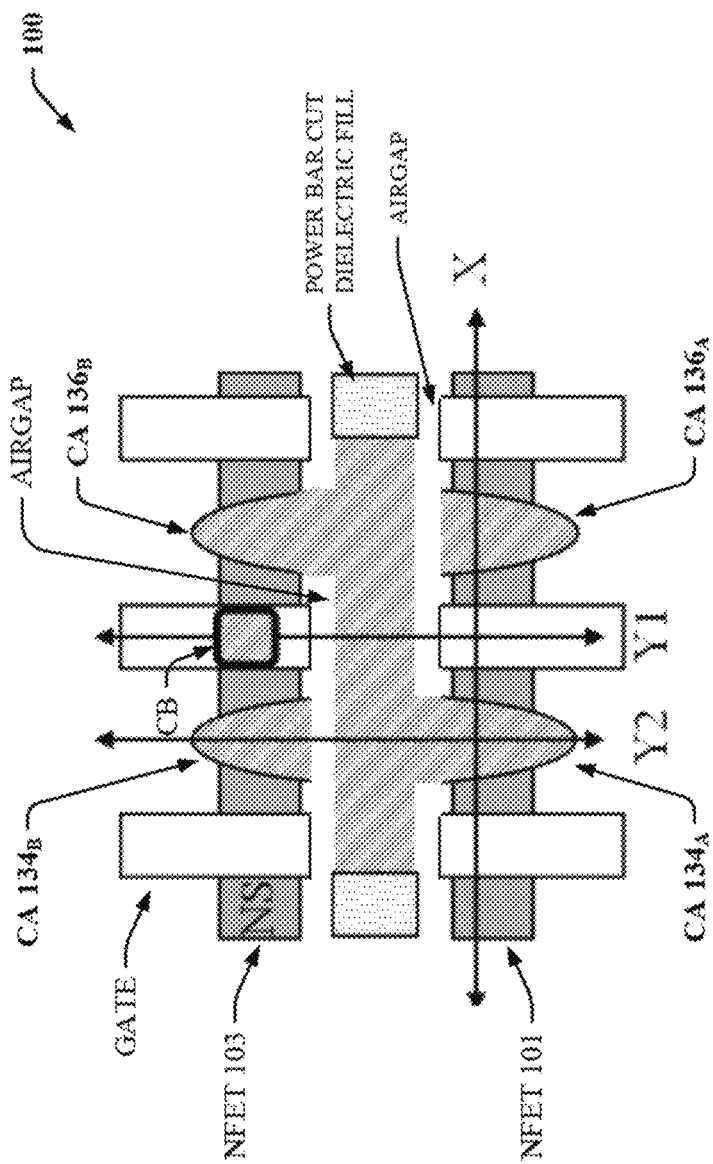
FIG. 1A illustrates an example, non-limiting top view of a semiconductor device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Semiconductors are used in components of several electronic devices, such as high performance or low power logic devices, memories, etc. As the semiconductor industry has grown, the density of devices on semiconductor chips has increased. Increased density and decreasing spacing rules for semiconductor chips, can cause parasitic capacitance between active regions of a semiconductor device which can slow down an integrated circuit (IC) by introducing resistive-capacitive (RC) delays.

Parasitic capacitance can be caused within active regions of a semiconductor due to the proximity of such regions and/or components to one another. As illustrated in one or more embodiments herein, due to increased density demands for devices on semiconductors, as the N2N (n-type to n-type) or P2P (p-type to p-type) space scales, a 1×1 VBPR can be too small to meet resistance needs within the semiconductor. A via bar can be a good solution, however, via-to-PC (gate) parasitic capacitance can become a concern. For example, a power bar (also known as VBPR bar or power via) and a gate of a semiconductor device separated by a dielectric liner can form a parasitic capacitor, such as a metal-insulator-metal capacitor, that can cause the parasitic capacitance. Such parasitic capacitance does not provide any benefit and may cause the semiconductor behavior to depart from ideal behavior.

With regards to some existing techniques, airgaps between a gate electrode and source/drain contacts of a semiconductor can be utilized to reduce the parasitic capacitance. However, such existing techniques often do not address minimizing parasitic capacitance between a power bar and gate ends of a semiconductor device or between the power bar and one or more contacts of a semiconductor device. Some existing techniques also do not utilize a power bar, wherein a power bar can be a good solution to meet resistance needs withing a semiconductor device. Thus, methods and structures that can address one or more of the challenges discussed herein while being easy to detect, use and implement in the industry, can be desirable.

To that end, various embodiments herein relate to a unique structure and method of forming a semiconductor device that can have a number of advantages. For example, the various embodiments herein can comprise a semiconductor device that can be fabricated to comprise airgaps between a power bar of the semiconductor device and gate ends of a high-k metal gate (HKMG) of the semiconductor device. The air gaps can be formed such that the air gaps can extend between the power bar and one or more contacts of the semiconductor device, thereby reducing parasitic capacitance between the one or more contacts and the power bar, while the power bar can wire FEOL S/D regions of the semiconductor device to a BSPR (backside power rail) by being connected to one or more other contacts. The various embodiments of the semiconductor device discussed herein can be applicable to electronic devices, such as high performance or low power logic devices, memories, etc.

The air gaps can be formed by selectively recessing a dielectric liner between the power bar and the gate ends and between the power bar and one or more contacts. In some embodiments, the dielectric liner can be recessed half-way down to the bottom of the gates. In some other embodiments, the dielectric liner can be recessed all the way down to the bottom of the gates. The level of benefit of reduced parasitic capacitance in the semiconductor device can depend on the level to which the dielectric liner is recessed. This has been further elaborated in FIG. 11B. In some embodiments, the dielectric liner can be formed from a dielectric material such as SiCO. In some other embodiments, Silicon Carbide (SiC) or nitride maybe used as the dielectric material for the dielectric liner. In yet other embodiments, other dielectric materials can be used to form the dielectric liner.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively form an airgap spacer between a power bar and gate ends or contacts of a semiconductor device as the one or more embodiments described herein can enable this process. And, neither can the human mind nor a human with pen and paper form an airgap spacer between a power bar and gate ends or contacts of a semiconductor device, as conducted by one or more embodiments described herein.

It should also be understood that when an element such as Silicon layer, etc. is referred to as being "on" or "over" another element, it can be directly on the other element or intervening elements can also be present. In contrast, when an element is referred to as being "directly on" or "directly over" another element, there are no intervening elements present. It should also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

These and other aspects and embodiments of the disclosed subject matter will now be described with respect to the drawings. It is to be appreciated that the words "semiconductor", "semiconductor device" and "semiconductor chip" have been used interchangeably throughout this specification. Similarly, the words "gate/s" and "gate end/s" have been used interchangeably throughout this specification. It is to be further appreciated that individual cross-sectional views X, Y1 and Y2 of the semiconductor device are respectively identified as X, Y1 and Y2 in the figures. The cross-sectional views Y1 and Y2 are presented as viewed from the left side of the top views. The cross-sectional view X is presented as viewed from the bottom of the top views.

FIG. 1A illustrates an example, non-limiting top view 100 of a semiconductor device in accordance with one or more embodiments described herein.

Figure 1B:
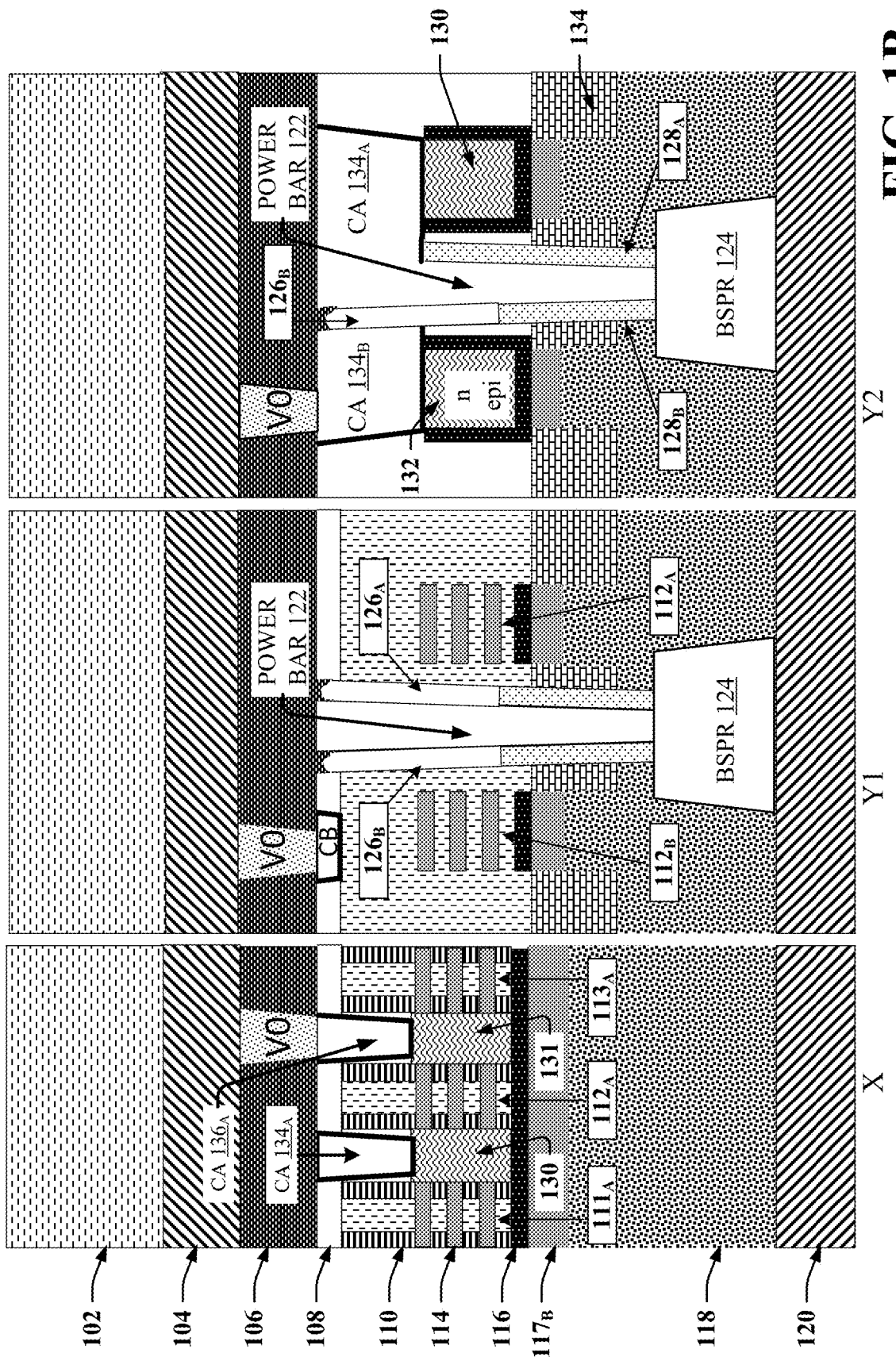
FIG. 1B illustrates example, non-limiting cross-sectional views of a semiconductor device in accordance with one or more embodiments described herein.

In an embodiment, a semiconductor device can comprise two nanosheet field effect transistors (NFETs), an HKMG, contacts, a power bar, and a dielectric liner. In FIG. 1, the NFETs are illustrated as NFET 101 and NFET 103. It is to be appreciated that a voltage source supply (VSS) backside power rail under cell boundary region near the NFETs has been used here for illustration purposes, and the one or more embodiments discussed herein can work the same at the cell boundary between the PFETs. Further, in FIG. 1, the HKMG is identified simply as GATE and the contacts are identified as contact CB, contact CA 134 and contact CA 136. The term "high-k," as used herein, refers to a material having a relatively high dielectric constant (k) as compared to that of Silicon Dioxide ($SiO_2$), such as, for example, Hafnium Oxide (HfO$_2$). Top view 100 further illustrates locations X, Y1 and Y2 representing cross-sectional views of the semiconductor device. The cross-sectional views X, Y1 and Y2 are further elaborated in FIG. 1B. As noted earlier, the cross-sectional views Y1 and Y2 are presented as viewed from the left side of the top views. The cross-sectional view X is presented as viewed from the bottom of the top views.

FIG. 1B illustrates example, non-limiting cross-sectional views of a semiconductor device in accordance with one or more embodiments described herein. Repetitive description of like elements and/or processes employed in respective embodiments is omitted for sake of brevity.

Figure 15:
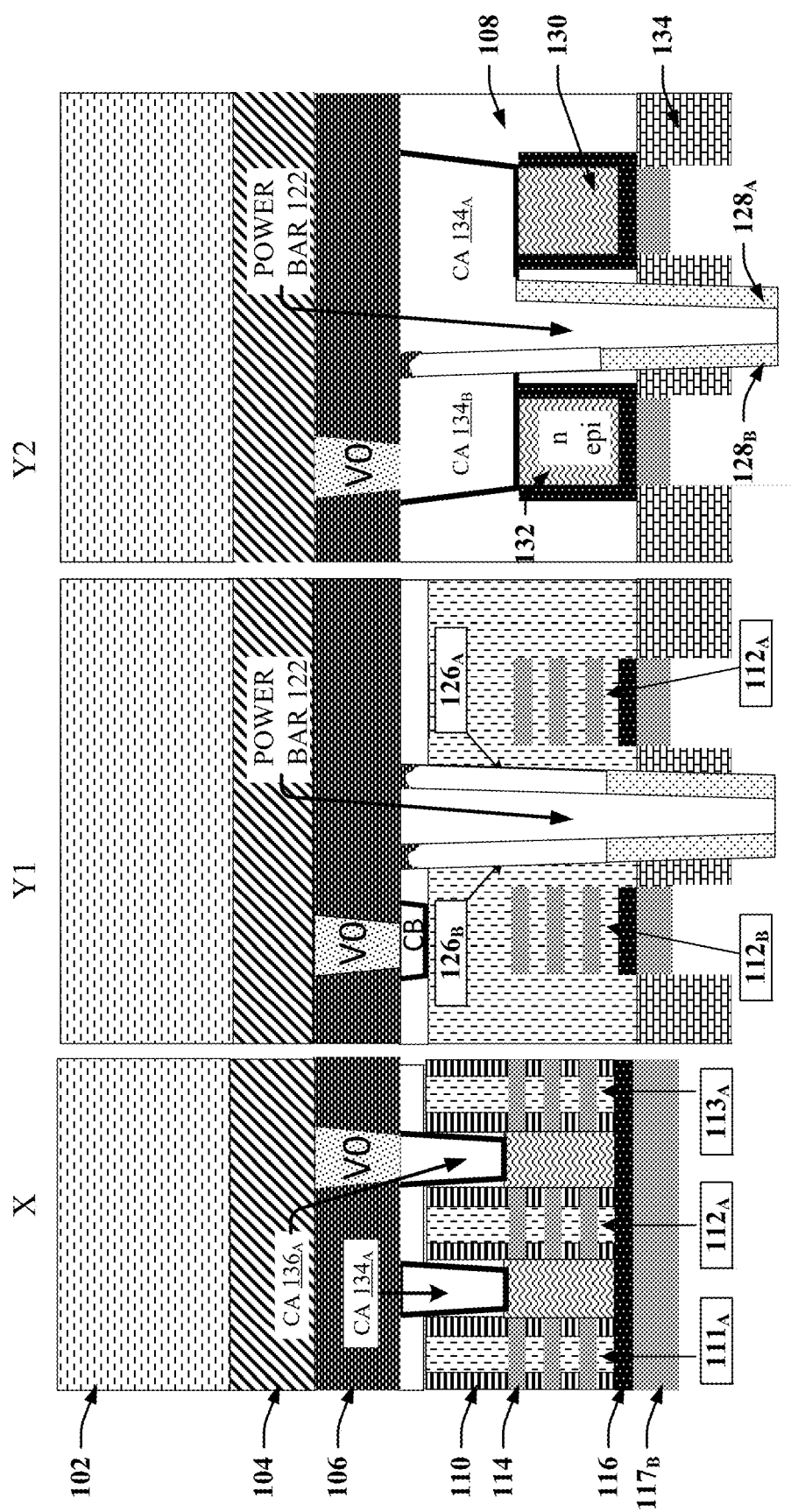
FIG. 15 illustrates example, non-limiting cross-sectional views of a step comprising recessing a Silicon layer in a semiconductor device fabrication process in accordance with one or more embodiments described herein.

In an embodiment, a semiconductor device can comprise carrier wafer layer 102, BEOL layer 104, non-conformal ILD layer 106, ILD layer 108, gate spacer and inner spacer 110, Silicon layer 114, bottom dielectric isolation (BDI) layer 116, remaining Silicon (Si) layer 117$_B$ (e.g., Silicon layer remaining after recessing a Silicon layer, as illustrated in FIG. 15), backside interlayer dielectric (BILD) layer 118 and backside power deliver network (BSPDN) layer 120, as illustrated by at least the cross-sectional view X of the semiconductor device. Some of the layers of the semiconductor listed herein are also illustrated in cross-sectional view Y1 and Y2.

It is to be appreciated that in the top views and cross-sectional views illustrated in the figures, individual layers and regions of the semiconductor are represented by individual patterns and the patterns for the respective layers and regions of the semiconductor device are consistent throughout the top views and cross-sectional views. It is to be further appreciated that the patterns for the individual layers and regions of the semiconductor device are different for the cross-sectional views as opposed to the top views, for the purpose of simplicity of illustration. For example, the contacts (e.g., contact CA 134, contact CA 136, contact CB) are consistently illustrated in the top views with diagonal stripes whereas the contacts are consistently illustrated without any pattern in the cross-sectional views.

The cross-sectional view X further illustrates contact CA 134$_A$, contact CA 136$_A$, gate 111$_A$, gate 112$_A$ and gate 113$_A$. The cross-sectional view Y1 of the semiconductor device illustrates contact CB, airgap 126$_A$ (e.g., first airgap), airgap 126$_B$ (e.g., second airgap), gate 112$_A$, gate 112$_B$, power bar 122 and BSPR 124. The cross-sectional view Y2 of the semiconductor device illustrates contact CA 134$_A$ and contact CA134$_B$, wherein contact CA134$_A$ and contact CA134$_B$ can be described as two different contacts that can result from contact CA 134 (FIG. 5A) after formation of late gate cuts in the semiconductor device. Similarly, contact CA 136 (FIG. 5A) can result in the formation of two different contacts (e.g., CA136$_A$ and contact CA136$_B$) after formation of late gate cuts in the semiconductor device. The cross-sectional view Y2 of the semiconductor device further illustrates an S/D region 130, airgap 126$_B$, shallow trench isolation (STI) layer 134, dielectric liner 128$_A$ and dielectric liner 128$_B$. S/D region 130 can be an FEOL region.

In one or more embodiments discussed herein, power bar 122 can be wired to BSPR 124, wherein power bar 122 can be located between a first gate (e.g., gate 112$_A$) of a first FET (e.g., NFET 101 of FIG. 1A) and a second gate (e.g., gate 12B) of a second FET (e.g., NFET 103 of FIG. 1A). In one or more embodiments discussed herein, the semiconductor device can comprise at least a first airgap (e.g., airgap 126$_A$) between power bar 122 and at least a portion of the first gate (e.g., gate 112$_A$) of the first FET (e.g., NFET 101 of FIG. 1A) and a second airgap (e.g., airgap 126$_B$) between power bar 122 and at least a portion of the second gate (e.g., gate 112$_B$) of the second FET (e.g., NFET 103 of FIG. 1A), wherein the at least the first airgap and the second airgap maintain parasitic capacitance in the semiconductor device below a threshold. The first FET (e.g., NFET 101 of FIG. 1A) can comprise a first source region and a first drain region (e.g., S/D region 130), wherein the first source region and the first drain region are connected to a first contact (e.g., CA 134$_A$) on a frontside of the first FET, and wherein a dielectric liner (e.g., dielectric liner 128$_A$) is present under the first contact such that an airgap is absent under the first contact. The second FET (e.g., NFET 103 of FIG. 1A) comprises a second source region and a second drain region (e.g., S/D region 132), wherein the second source region and the second drain region are connected to a second contact (e.g., CA 134$_B$) on a frontside of the second FET. The words "n epi" illustrated on S/D region 132 are representative of an n-type doped epitaxial S/D structure. It is to be appreciated that S/D region 130, S/D region 131 and S/D region 132 can be epitaxial S/D regions.

The semiconductor device can further comprise a BSPDN (e.g., BSPDN layer 120) on a backside of the first FET (e.g., NFET 101 of FIG. 1A) and the second FET (e.g., NFET 103 of FIG. 1A), wherein the BSPDN is connected to power bar 122 via BSPR 124. Power bar 122 can be located on a frontside of the first FET (e.g., NFET 101 of FIG. 1A) and the second FET (e.g., NFET 103 of FIG. 1A). A third contact (e.g., CA 136$_A$) can be connected to a second source region and a second drain region of the first FET (e.g., S/D region 131), wherein the first airgap (e.g., airgap 126$_A$) extends between the third contact and power bar 122. Similarly, airgap 126$_B$ can extend between power bar 122 and contact CA 134$_B$. A dielectric liner is present under the first airgap and the second airgap. For example, dielectric liner 128$_A$ is present under airgap 126$_A$. For example, dielectric liner 128$_B$ is present under airgap 126$_B$. The presence of airgaps (i.e., airgap 126$_A$ and airgap 126$_B$) has the advantage of reducing parasitic capacitance between power bar 122 and the gates (i.e., gate 112$_A$ and gate 112$_B$) and between power bar 122 and one or more contacts (i.e., contact 134$_B$ and contact 134$_A$). The airgaps (i.e., airgap 126$_A$ and airgap 126$_B$) can be formed by pulling down (recessing) the respective dielectric liners (i.e., dielectric liner 128$_A$ and dielectric liner 128$_B$) to a desired distance, as illustrated in the subsequent figures.

It is to be appreciated that several layers of the semiconductor device illustrated in the cross-sectional views of FIG. 1B are also illustrated in cross-sectional views shown in other figures, although only some layers are discussed in detail for sake of brevity.

Figure 1C:
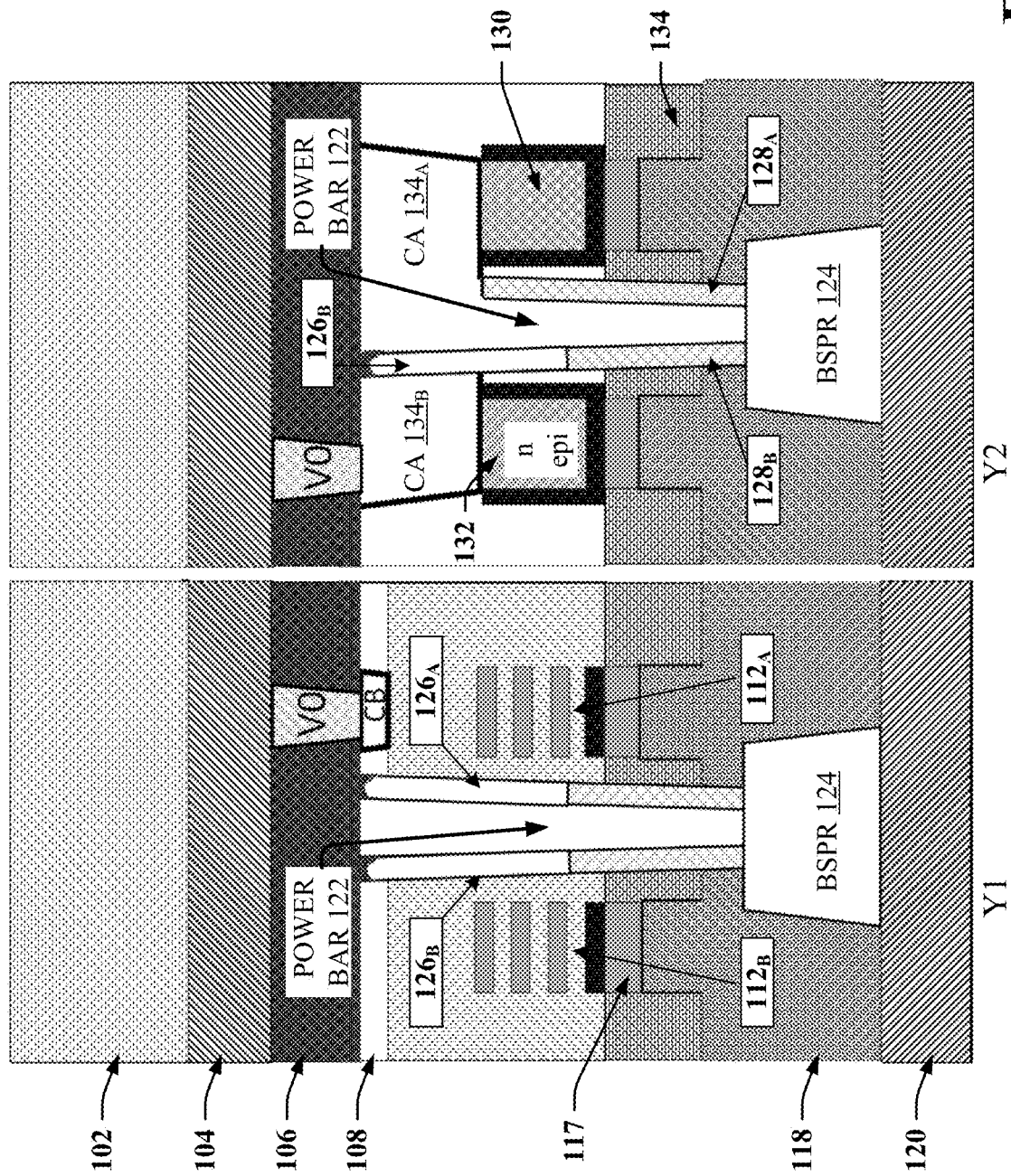
FIG. 1C further illustrates example, non-limiting cross-sectional views of a semiconductor device in accordance with one or more embodiments described herein.

FIG. 1C further illustrates example, non-limiting cross-sectional views of a semiconductor device in accordance with one or more embodiments described herein. Repetitive description of like elements and/or processes employed in respective embodiments is omitted for sake of brevity.

FIG. 1C illustrates cross-sectional views Y1 and Y2 of the semiconductor device such that contact CB is placed above gate 112$_A$. FIG. 1C illustrates an alternate position for contact CB within the semiconductor device. The position of contact CB in the subsequent figures is consistent with FIGS. 1A and 1B. FIGS. 2-17 illustrate steps involved in a method of forming the semiconductor device. The process of semiconductor chip fabrication can be generally divided into three major line cycles comprising an FEOL cycle, an MOL cycle and a BEOL cycle. The FEOL cycle can begin from bare Silicon to building up to a contact level for connections, the MOL cycle can begin from developing contacts, and the BEOL cycle can comprise the formation of interconnects within the semiconductor device.

FIG. 2 illustrates an example, non-limiting cross-sectional view 200 of a starting substrate in accordance with one or more embodiments described herein. Repetitive description of like elements and/or processes employed in respective embodiments is omitted for sake of brevity.

The method of formation of the semiconductor device comprising the airgaps (i.e., airgap $126_A$ and airgap $126_B$) can begin with a starting substrate as illustrated in FIG. 2. The starting substrate can comprise Silicon substrate $117_A$ at the base (growing the Si epi layer>700 um can result in a high cost), etch stop layer 206 over Silicon substrate $117_A$ and remaining Si layer $117_B$ over etch stop layer 206. The starting substrate can further comprise (Silicon-Germanium) SiGe layer 204 (with Ge % ranging from 50% to 70%) over remaining Si layer $117_B$, and an NS stack of alternating layers of SiGe layer 202 (with Ge % ranging from 20% to 35%) and Silicon layer 114 over SiGe layer 204.

Figure 3A:
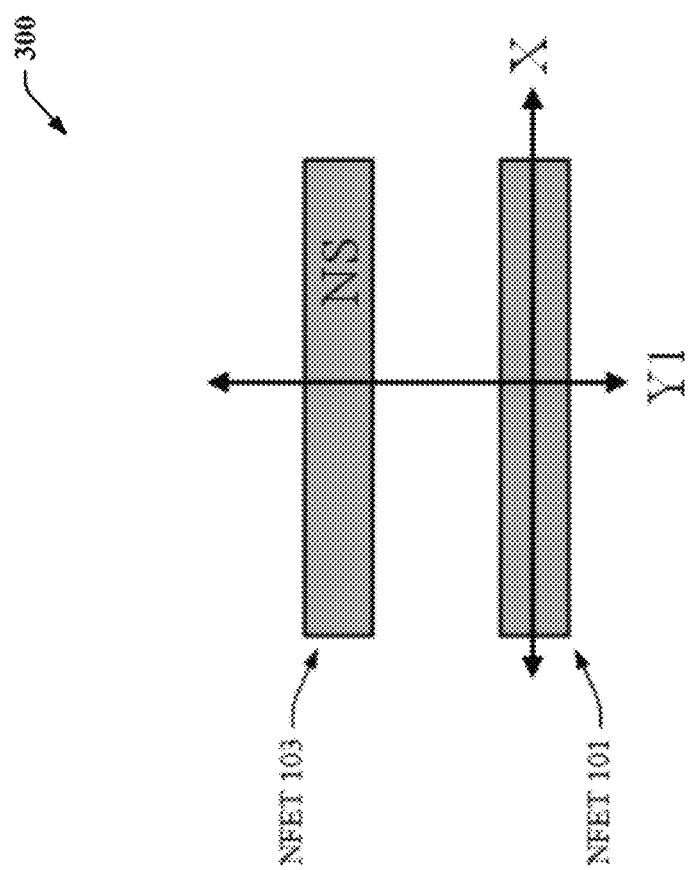
FIG. 3A illustrates an example, non-limiting top view of a step comprising nanosheet (NS) patterning in a semiconductor device fabrication process in accordance with one or more embodiments described herein.

FIG. 3A illustrates an example, non-limiting top view 300 of a step comprising NS patterning in a semiconductor device fabrication process in accordance with one or more embodiments described herein. Repetitive description of like elements and/or processes employed in respective embodiments is omitted for sake of brevity.

The next steps in the method of forming the semiconductor device can comprise NS patterning on a starting substrate (e.g., starting substrate of FIG. 2). As such, top view 300 illustrates NFET 101, NFET 103 and NSs patterned on the starting substrate (e.g., starting substrate of FIG. 2). Top view 300 further illustrates locations for cross-sectional views X and Y1.

Figure 3B:
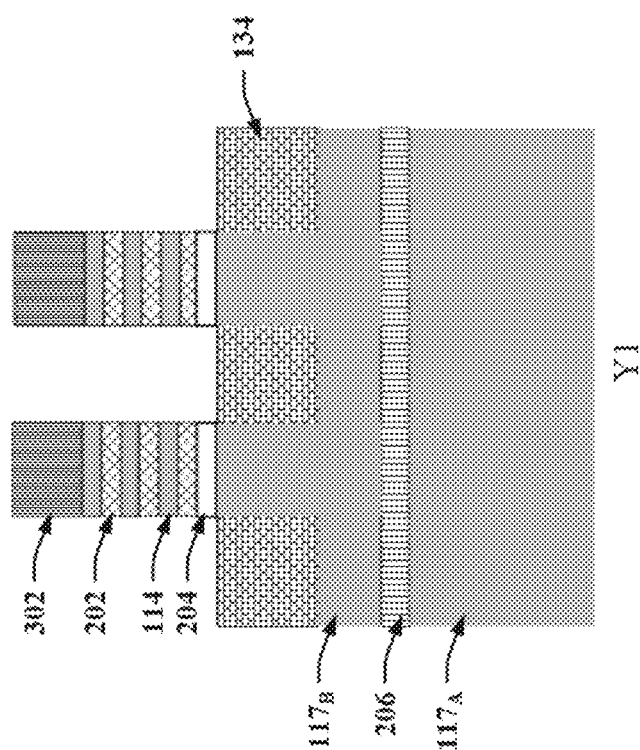
FIG. 3B illustrates example, non-limiting cross-sectional views of a step comprising NS patterning in a semiconductor device fabrication process in accordance with one or more embodiments described herein.

FIG. 3B illustrates example, non-limiting cross-sectional views of a step comprising NS patterning in a semiconductor device fabrication process in accordance with one or more embodiments described herein. Repetitive description of like elements and/or processes employed in respective embodiments is omitted for sake of brevity.

FIG. 3B illustrates SiGe layer 202, SiGe layer 204, etch stop layer 206, Silicon layer 114, Silicon substrate $117_A$ and remaining Si layer $117_B$. Patterning is the shaping or altering of deposited materials and is generally referred to as lithography. Thus, NS patterning can comprise patterning of the NS stack of alternating layers of SiGe layer 202 and Silicon layer 114 of the starting substrate illustrated in FIG. 2 to form active regions of NFET 101 and NFET 103. Before NS patterning, a hard mask (HM) layer 302 can be deposited over the topmost SiGe 25 layer (e.g., topmost SiGe layer 202). An HM can typically be a nitride, oxide, or metal (e.g., Silicon Nitride (SiN), Silicon Oxide (SiO), etc.). FIG. 3B further illustrates STI layer 134. STI layer 134 can be a dielectric such as oxides of Silicon (e.g., SiO). STI can facilitate isolation of active regions (e.g., NFET 101 and NFET 103) within the semiconductor device by deposition of the dielectric.

FIG. 4A illustrates an example, non-limiting top view 400 of a step comprising forming an FEOL device in a semiconductor device fabrication process in accordance with one or more embodiments described herein. Repetitive description of like elements and/or processes employed in respective embodiments is omitted for sake of brevity.

Figure 4B:
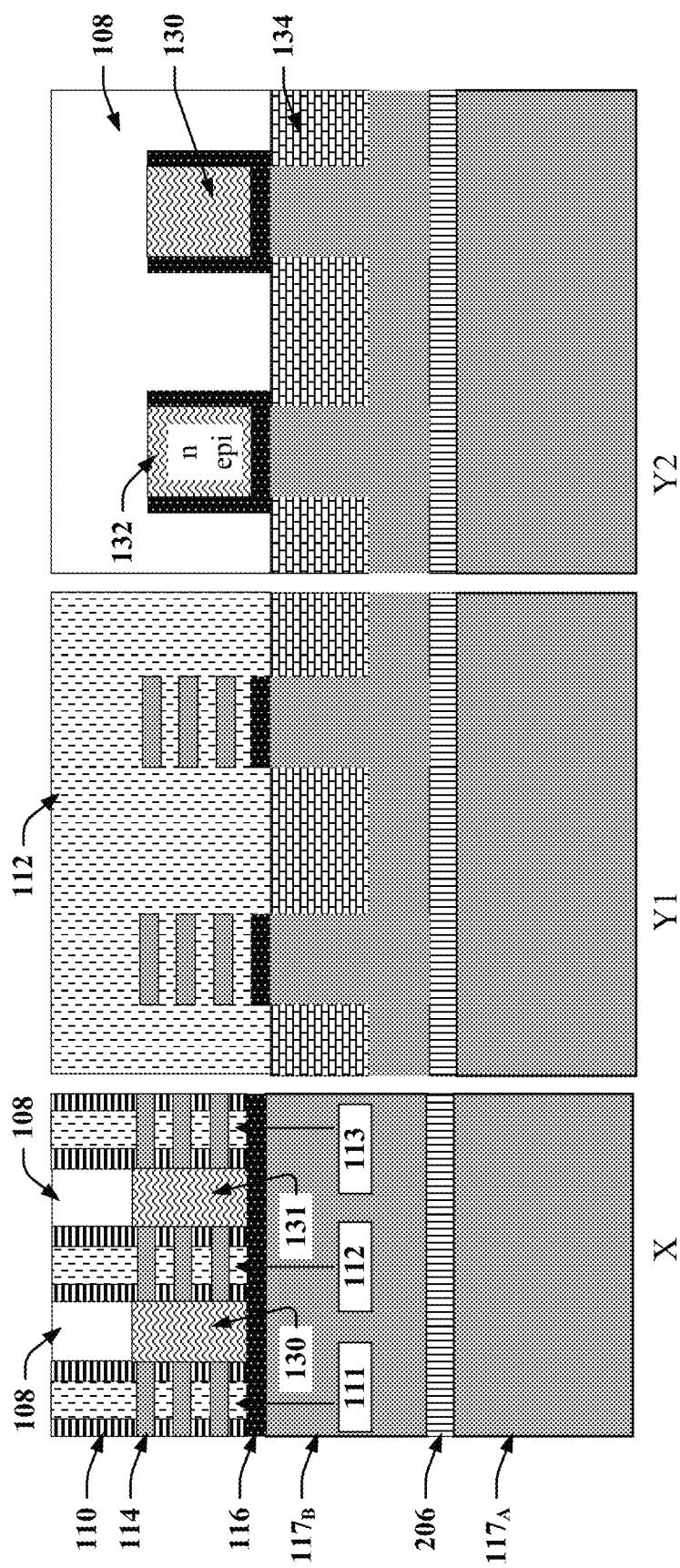
FIG. 4B illustrates example, non-limiting cross-sectional views of a step comprising forming an FEOL device in a semiconductor device fabrication process in accordance with one or more embodiments described herein.

Top view 400 illustrates NFET 101, NFET 103 and an HKMG (illustrated simply as GATE). Individual sections of the HKMG are illustrated as gate 111, gate 112 and gate 113, which are also illustrated in FIG. 4B. After formation of late gate cuts in the semiconductor device, gate 111 can result in the formation of gate $111_A$ and gate $111_B$, gate 112 can result in the formation of gate $112_A$ and gate $112_B$, and gate 113 can result in the formation of gate $113_A$ and gate $113_B$. Top view 400 further illustrates locations for cross-sectional views X, Y1 and Y2.

FIG. 4B illustrates example, non-limiting cross-sectional views of a step comprising forming an FEOL device in a semiconductor device fabrication process in accordance with one or more embodiments described herein. Repetitive description of like elements and/or processes employed in respective embodiments is omitted for sake of brevity.

FIG. 4B illustrates gate spacer and inner spacer 110, Silicon layer 114, BDI layer 116, remaining Si layer $117_B$, Silicon substrate $117_A$ and etch stop layer 206, amongst other layers. Following NS patterning and STI formation, an FEOL device can be formed after replacement HKMG formation. The FEOL device can comprise BDI layer 116, gate spacer and inner spacer 110, HKMG (as described in FIG. 4A), S/D region 130, S/D region 131, S/D region 132 and ILD layer 108. The layers described herein can be formed via a standard process flow for semiconductor devices. BDI layer 116 can be formed from dielectric materials such as SiN, Silicon oxycarbonitride (SiOCN), Silicon oxycarbide (SiOC), SiBCN, etc., and can be formed together with a gate spacer after SiGe layer 204 is removed. Inner spacer (e.g., inner spacer of gate spacer and inner spacer 110) can be formed around the gates (gate 111, gate 112, gate 113) from an insulating material similar to or the same as the gate spacer to isolate the gates from the S/D regions (e.g., S/D region 130, S/D region 131, S/D region 132).

The HKMG can be formed by deposition of a high-k material, and metal gates. Deposition is any process that grows, coats, or otherwise transfers a material onto a substrate. Available technologies include, but are not limited to, dielectric spin-on, thermal oxidation, physical vapor deposition (PVD), chemical vapor deposition (CVD), electrochemical deposition (ECD), molecular beam epitaxy (MBE) and more recently, atomic layer deposition (ALD) among others. As discussed in one or more embodiments, the term "high-k," as used herein, refers to a material having a relatively high dielectric constant (k) as compared to that of $SiO_2$, such as, for example, Hafnium Oxide ($HfO_2$). Metal gates comprise workfunction metals, such as Titanium nitride (TiN), Titanium carbide (TiC), Titanium aluminide (TiAl), TiAlC, etc., and conductive metal fills, such as Tungsten (W). S/D regions (e.g., S/D region 130, S/D region 131, S/D region 132) can be formed from in-situ epitaxial materials such as epitaxial Si, epitaxial SiGe, etc., and the doping type can be either n-type or p-type depending on the device polarity. Similarly, ILD layer 108 can be formed by employing suitable deposition techniques.

Figure 5A:
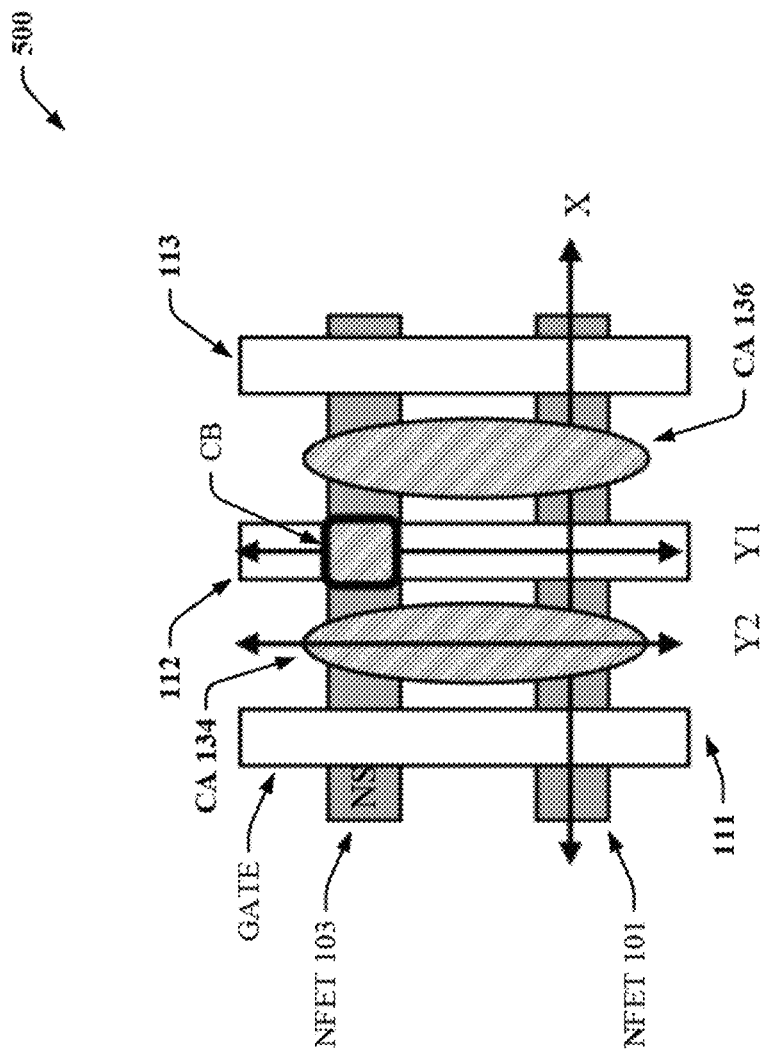
FIG. 5A illustrates an example, non-limiting top view of a step comprising forming middle-of-line (MOL) contacts in a semiconductor device fabrication process in accordance with one or more embodiments described herein.

FIG. 5A illustrates an example, non-limiting top view 500 of a step comprising forming MOL contacts in a semiconductor device fabrication process in accordance with one or more embodiments described herein. Repetitive description of like elements and/or processes employed in respective embodiments is omitted for sake of brevity.

Figure 5B:
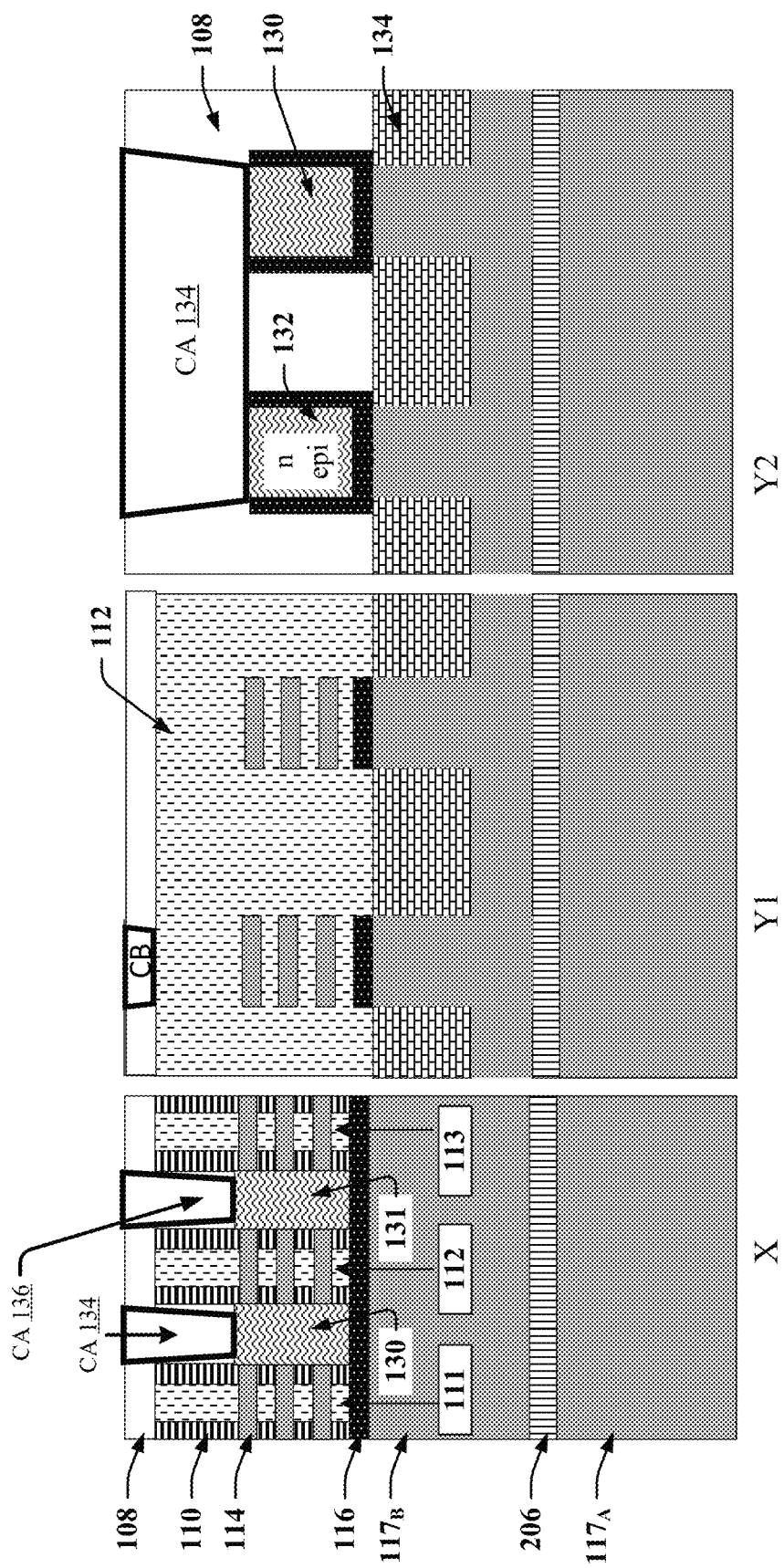
FIG. 5B illustrates example, non-limiting cross-sectional views of a step comprising forming MOL contacts in a semiconductor device fabrication process in accordance with one or more embodiments described herein.

Top view 500 illustrates NFET 101, NFET 103, gate 111, gate 112, gate 113, contact CA 134, contact CA 136 and contact CB, which are also illustrated in FIG. 5B. Top view 500 further illustrates locations for cross-sectional views X, Y1 and Y2.

FIG. 5B illustrates example, non-limiting cross-sectional views of a step comprising forming MOL contacts in a semiconductor device fabrication process in accordance with one or more embodiments described herein. Repetitive description of like elements and/or processes employed in respective embodiments is omitted for sake of brevity.

FIG. 5B illustrates gate spacer and inner spacer 110, Silicon layer 114, BDI layer 116, remaining Si layer 117$_B$, Silicon substrate 117$_A$ and etch stop layer 206, amongst other layers. Following FEOL device and gate formation, source/drain contacts (e.g., contact CA 134, contact CA 136) and gate contact (contact CB) can be formed.

Figure 6A:
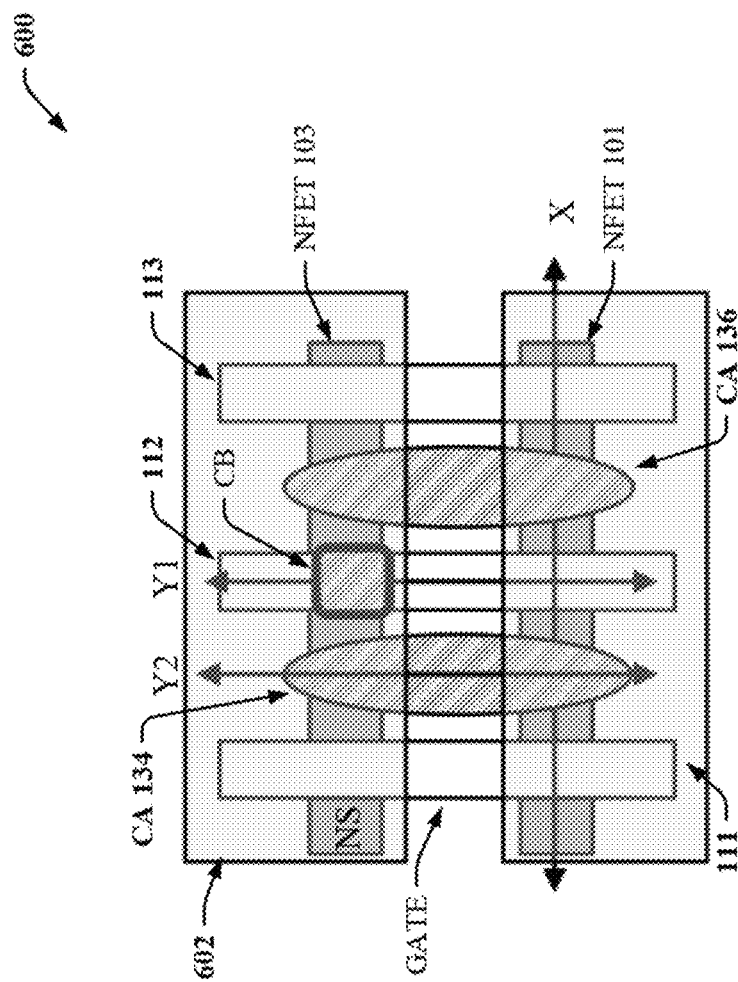
FIG. 6A illustrates an example, non-limiting top view of a step comprising forming late gate cuts in a semiconductor device fabrication process in accordance with one or more embodiments described herein.

FIG. 6A illustrates an example, non-limiting top view 600 of a step comprising forming late gate cuts in a semiconductor device fabrication process in accordance with one or more embodiments described herein. Repetitive description of like elements and/or processes employed in respective embodiments is omitted for sake of brevity.

Figure 6B:
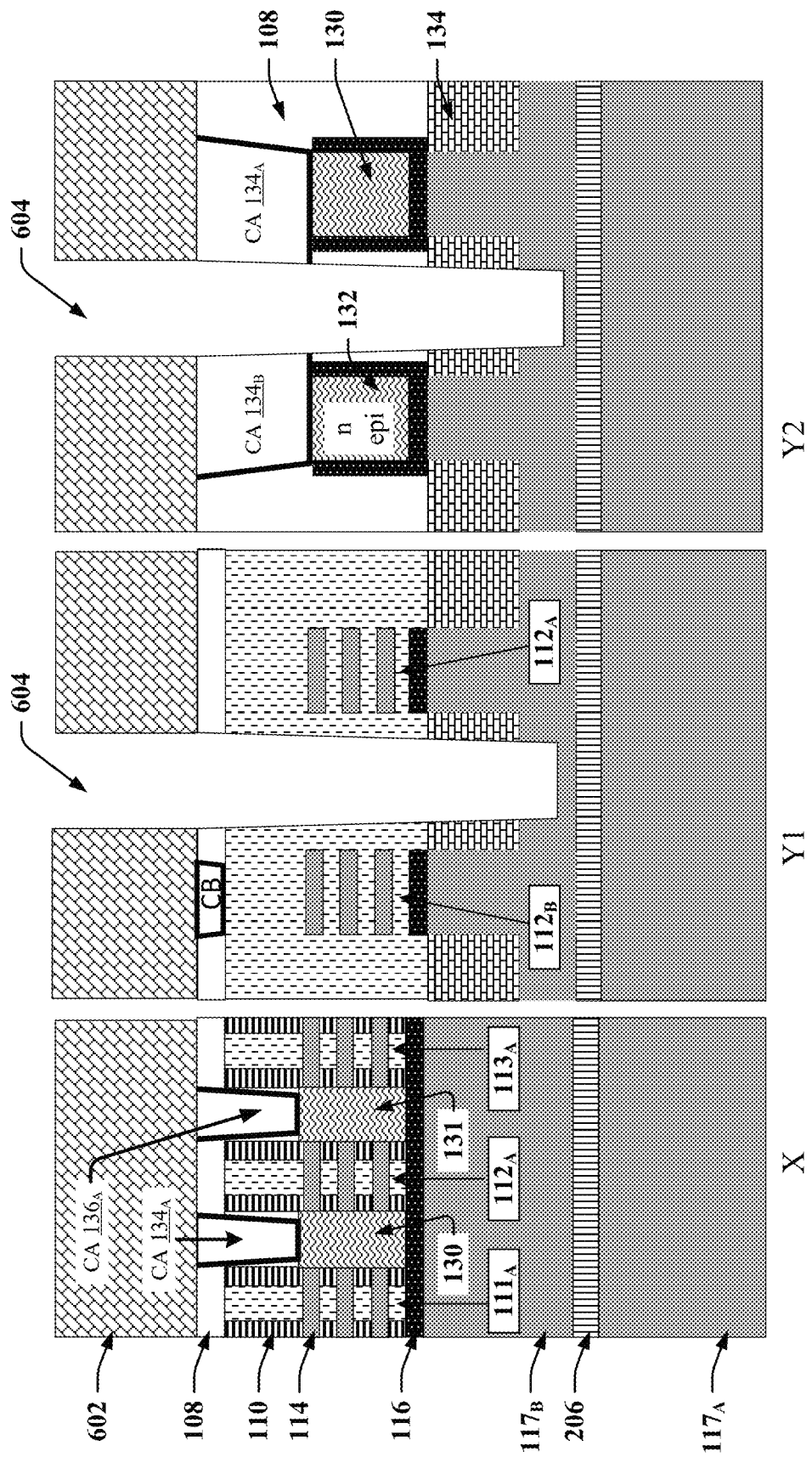
FIG. 6B illustrates example, non-limiting cross-sectional views of a step comprising forming late gate cuts in a semiconductor device fabrication process in accordance with one or more embodiments described herein.

Top view 600 illustrates NFET 101, NFET 103, gate 111, gate 112, gate 113, contact CA 134, contact CA 136, contact CB and masking layer 602 (such as OPL), which are also illustrated in FIG. 6B. Top view 600 further illustrates locations for cross-sectional views X, Y1 and Y2.

FIG. 6B illustrates example, non-limiting cross-sectional views of a step comprising forming late gate cuts in a semiconductor device fabrication process in accordance with one or more embodiments described herein. Repetitive description of like elements and/or processes employed in respective embodiments is omitted for sake of brevity.

FIG. 6B illustrates gate spacer and inner spacer 110, Silicon layer 114, BDI layer 116, remaining Si layer 117$_B$, Silicon substrate 117$_A$ and etch stop layer 206, amongst other layers. Following the formation of the source/drain contacts (e.g., contact CA 134, contact CA 136) and the gate contact (contact CB), masking layer 602 (such as OPL) can be deposited and patterned over ILD layer 108, and late gate and contact cuts can be formed in the semiconductors as illustrated by cut 604 in FIG. 6B. Forming late cuts can comprise cutting through several layers of the semiconductor device, including the source/drain contacts (e.g., contact CA 134, contact CA 136). As illustrated in FIG. 6B, cut 604 extends through the gates (e.g., gate 111, gate 112 and gate 113), masking layer 602 (such as OPL), ILD layer 108, STI layer 134 and remaining Si layer 117$_B$.

Figure 7A:
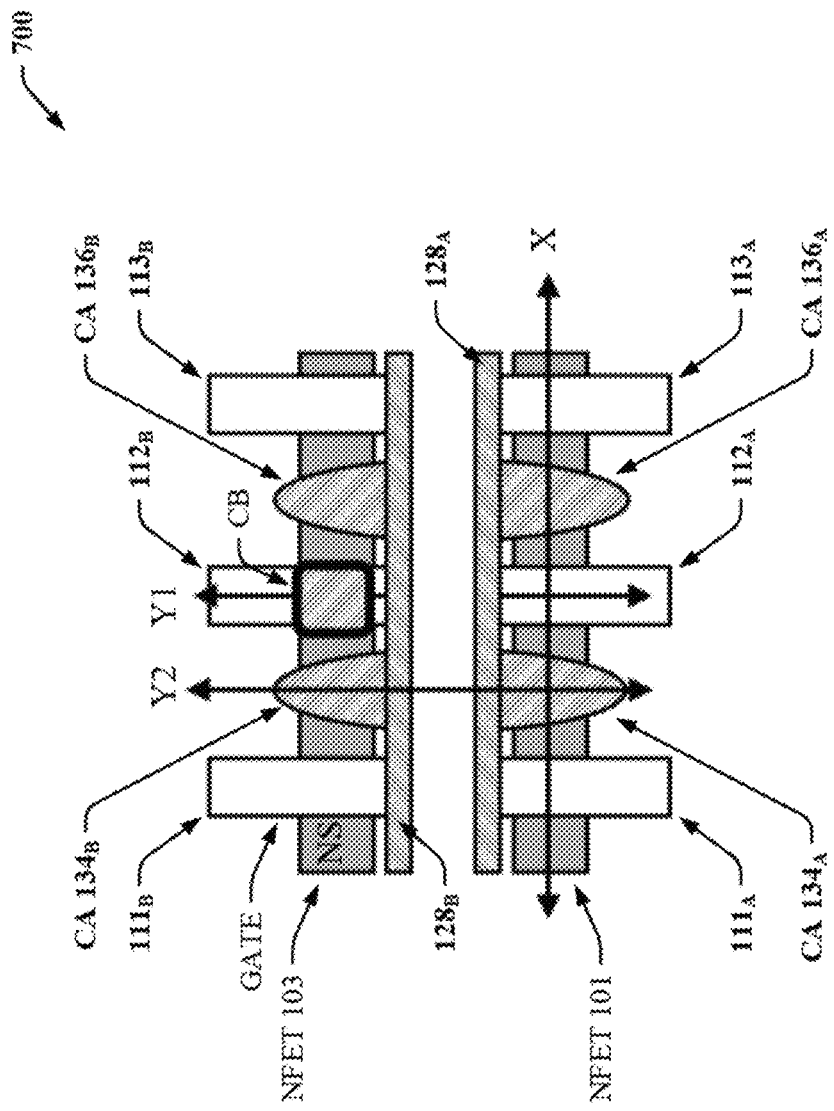
FIG. 7A illustrates an example, non-limiting top view of a step comprising forming a dielectric liner in a semiconductor device fabrication process in accordance with one or more embodiments described herein.

FIG. 7A illustrates an example, non-limiting top view 700 of a step comprising forming a dielectric liner in a semiconductor device fabrication process in accordance with one or more embodiments described herein. Repetitive description of like elements and/or processes employed in respective embodiments is omitted for sake of brevity.

Figure 7B:
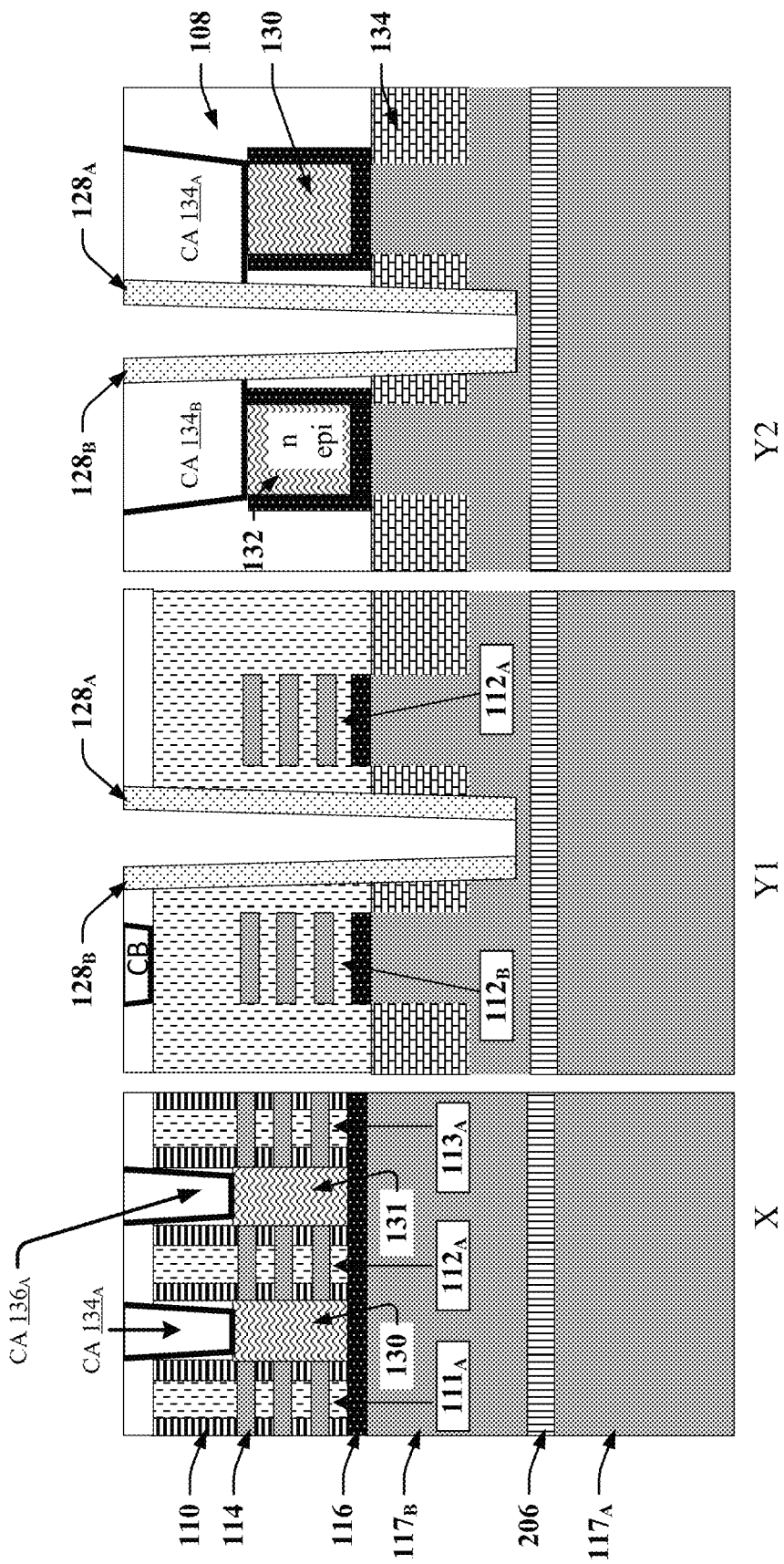
FIG. 7B illustrates example, non-limiting cross-sectional views of a step comprising forming a dielectric liner in a semiconductor device fabrication process in accordance with one or more embodiments described herein.

Top view 700 illustrates NFET 101, NFET 103, gate 111$_A$, gate 112$_A$, gate 113$_A$, gate 111$_B$, gate 112$_B$, gate 113$_B$, contact CA 134$_A$, contact CA 134$_B$, contact CA 136$_A$, contact CA 136$_B$, contact CB, dielectric liner 128$_A$ and dielectric liner 128$_B$, which are also illustrated in FIG. 7B. Top view 700 further illustrates locations for cross-sectional views X, Y1 and Y2.

FIG. 7B illustrates example, non-limiting cross-sectional views of a step comprising forming a dielectric liner in a semiconductor device fabrication process in accordance with one or more embodiments described herein. Repetitive description of like elements and/or processes employed in respective embodiments is omitted for sake of brevity.

FIG. 7B illustrates gate spacer and inner spacer 110, Silicon layer 114, BDI layer 116, remaining Si layer 117$_B$, Silicon substrate 117$_A$ and etch stop layer 206, amongst other layers. Following late cuts, OPL ashing and dielectric spacer liner formation can be performed. Ashing can be performed on masking layer 602 (such as OPL). Ashing can be used to remove a photoresist material, amorphous carbon, or OPL layer (e.g., masking layer 602). Ashing is performed using a suitable reaction gas, for example, $O_2$, $N_2$, $H_2/N_2$, $O_3$, $CF_4$, or any combination thereof. A spacer (e.g., dielectric liner 128$_A$ and dielectric liner 128$_B$) can be deposited in the late cuts, wherein the spacer can be a dielectric material such as SiC, SiCO, nitride, etc.

Figure 8A:
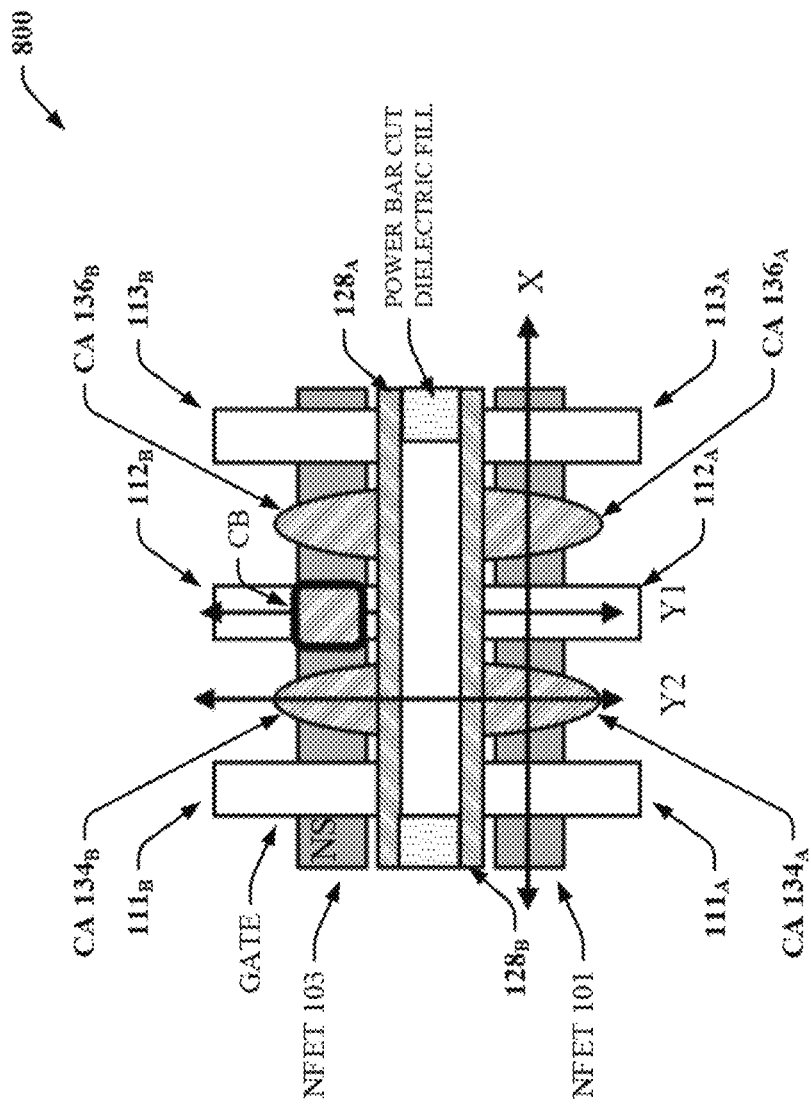
FIG. 8A illustrates an example, non-limiting top view of a step comprising filling cuts with a dielectric material in a semiconductor device fabrication process in accordance with one or more embodiments described herein.

FIG. 8A illustrates an example, non-limiting top view 800 of a step comprising filling cuts with a dielectric material in a semiconductor device fabrication process in accordance with one or more embodiments described herein. Repetitive description of like elements and/or processes employed in respective embodiments is omitted for sake of brevity.

Figure 8B:
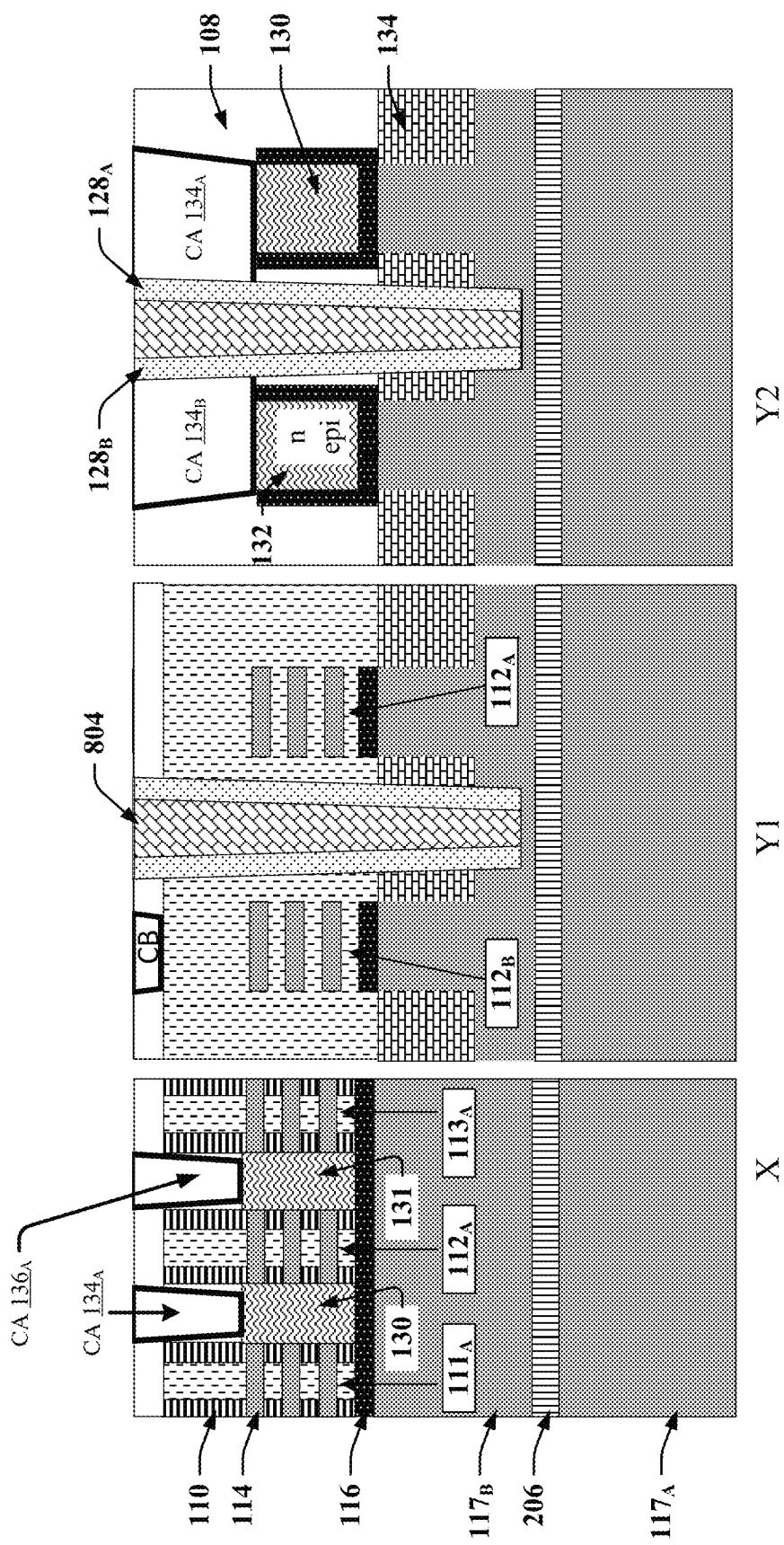
FIG. 8B illustrates example, non-limiting cross-sectional views of a step comprising filling cuts with a dielectric material in a semiconductor device fabrication process in accordance with one or more embodiments described herein.

Top view 800 illustrates NFET 101, NFET 103, gate 111$_A$, gate 112$_A$, gate 113$_A$, gate 111$_B$, gate 112$_B$, gate 113$_B$, contact CA 134$_A$, contact CA 134$_B$, contact CA 136$_A$, contact CA 136$_B$, contact CB, dielectric liner 128$_A$, dielectric liner 128$_B$ and a power bar cut and dielectric fill layer, some or all of which are also illustrated in FIG. 8B. Top view 800 further illustrates locations for cross-sectional views X, Y1 and Y2.

FIG. 8B illustrates example, non-limiting cross-sectional views of a step comprising filling cuts with a dielectric material in a semiconductor device fabrication process in accordance with one or more embodiments described herein. Repetitive description of like elements and/or processes employed in respective embodiments is omitted for sake of brevity.

FIG. 8B illustrates gate spacer and inner spacer 110, Silicon layer 114, BDI layer 116, remaining Si layer 117$_B$, Silicon substrate 117$_A$ and etch stop layer 206, amongst other layers. Following OPL ashing and forming the dielectric liners (e.g., dielectric liner 128$_A$ and dielectric liner 128$_B$), cut 604 can be filled with OPL layer 804. OPL layer 804 can be selectively cut at places to form a cut for power bar 122 (power bar cut), and the cut region can be further filled with a dielectric material such as SiN, as illustrated in top view 800 of FIG. 8A. Since cross-sectional views X, Y1 and Y2 do not pass through the dielectric material deposited after cutting OPL layer 802, it is not shown in FIG. 8B.

Figure 9A:
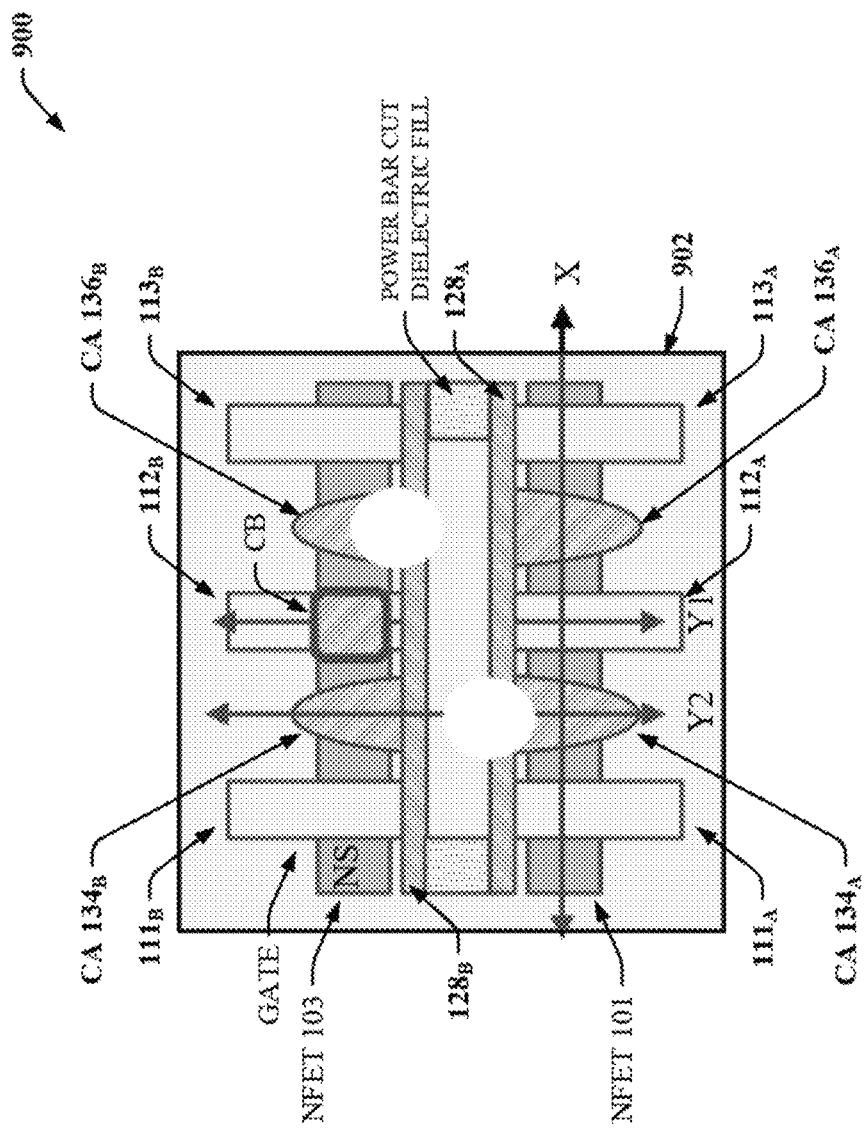
FIG. 9A illustrates an example, non-limiting top view of a step comprising VBPR patterning in a semiconductor device fabrication process in accordance with one or more embodiments described herein.

FIG. 9A illustrates an example, non-limiting top view 900 of a step comprising VBPR patterning in a semiconductor device fabrication process in accordance with one or more embodiments described herein. Repetitive description of like elements and/or processes employed in respective embodiments is omitted for sake of brevity.

Figure 9B:
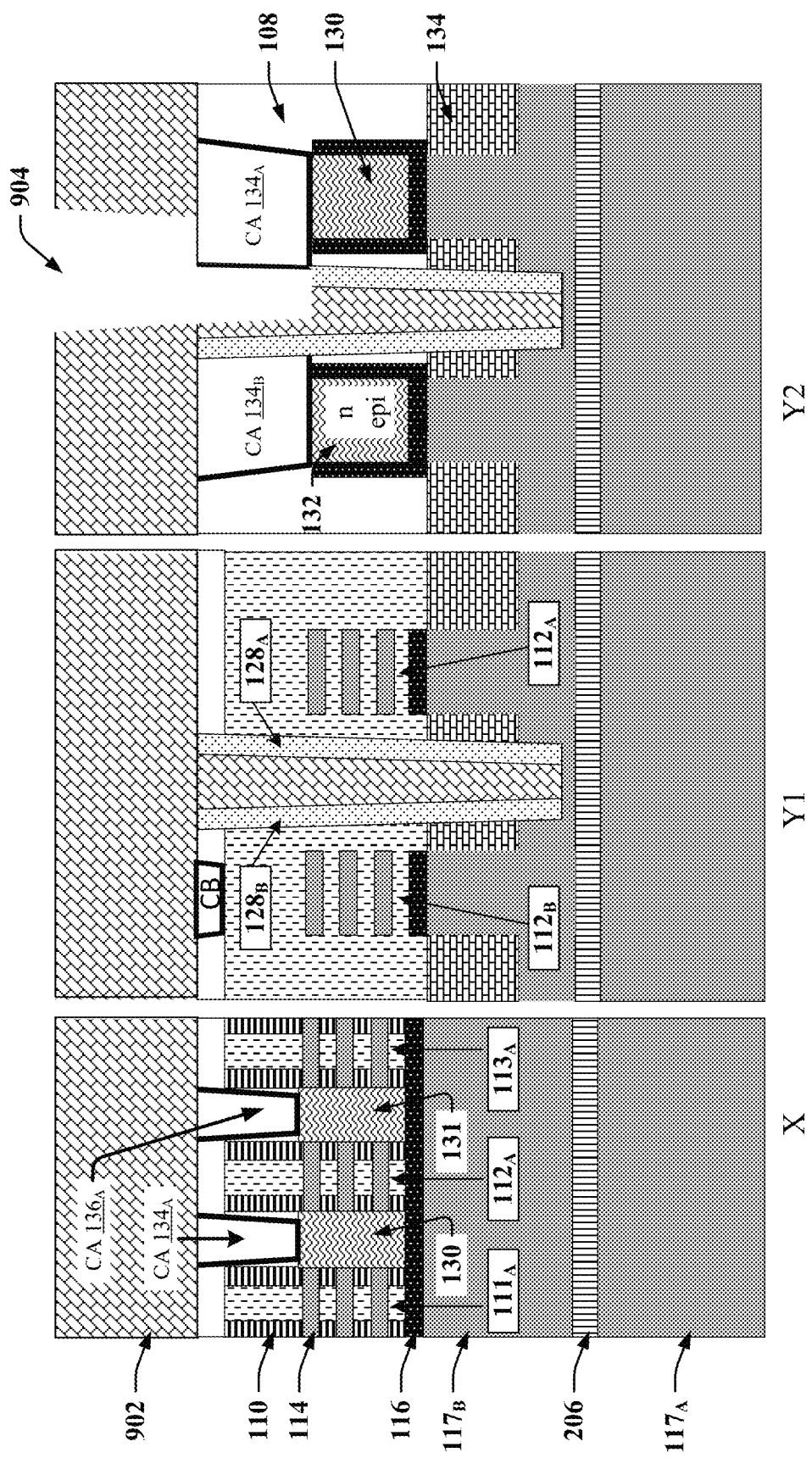
FIG. 9B illustrates example, non-limiting cross-sectional views of a step comprising VBPR patterning in a semiconductor device fabrication process in accordance with one or more embodiments described herein.

Top view 900 illustrates NFET 101, NFET 103, gate 111$_A$, gate 112$_A$, gate 113$_A$, gate 111$_B$, gate 112$_B$, gate 113$_B$, contact CA 134$_A$, contact CA 134$_B$, contact CA 136$_A$, contact CA 136$_B$, contact CB, dielectric liner 128$_A$, dielectric liner 128$_B$, dielectric fill layer, OPL layer 902 and VBPR patterning, some or all of which are also illustrated in FIG. 9B. Top view 900 further illustrates locations for cross-sectional views X, Y1 and Y2.

FIG. 9B illustrates example, non-limiting cross-sectional views of a step comprising VBPR patterning in a semiconductor device fabrication process in accordance with one or more embodiments described herein. Repetitive description of like elements and/or processes employed in respective embodiments is omitted for sake of brevity.

FIG. 9B illustrates gate spacer and inner spacer 110, Silicon layer 114, BDI layer 116, remaining Si layer 117$_B$, Silicon substrate 117$_A$ and etch stop layer 206, amongst other layers. Following the OPL layer 804 fill, power bar cut and dielectric material fill, VBPR patterning to selectively remove part of the exposed dielectric liner (e.g., dielectric liner 128$_A$ and dielectric liner 128$_B$), can be performed. This can be illustrated as the solid circles at the center of FIG. 9A and as cut 904 in FIG. 9B. For example, cut 904 can be performed to connect contact CA $134_A$ to power bar 122. At this stage, OPL layer 902 can be deposited over ILD layer 108.

As discussed in one or more embodiments herein, patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light. The exposed regions are then washed away by a developer solution. After etching or other processing, the remaining photoresist is removed. After transferring the pattern, the patterned photoresist is removed utilizing resist stripping processes, such as wet chemical clean or ashing. Ashing can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof. Patterning also includes electron-beam lithography, nanoimprint lithography, and reactive ion etching.

Figure 10A:
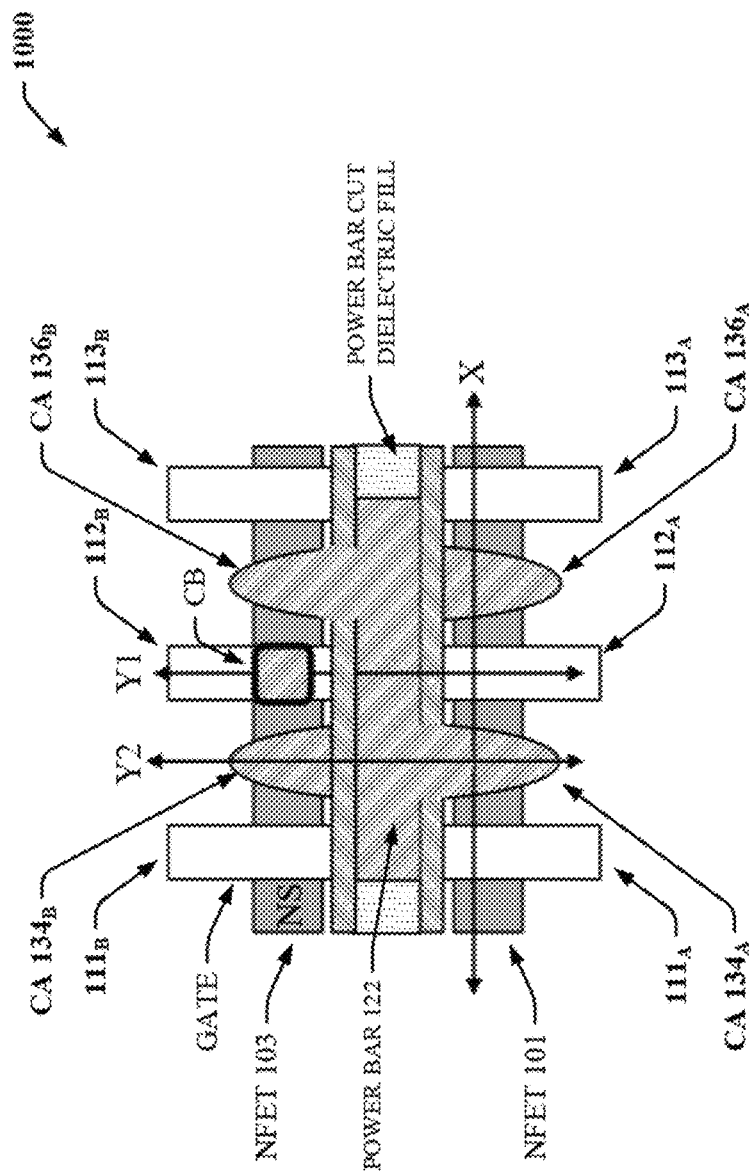
FIG. 10A illustrates an example, non-limiting top view of a metallization step in a semiconductor device fabrication process in accordance with one or more embodiments described herein.

FIG. 10A illustrates an example, non-limiting top view 1000 of a metallization step in a semiconductor device fabrication process in accordance with one or more embodiments described herein. Repetitive description of like elements and/or processes employed in respective embodiments is omitted for sake of brevity.

Figure 10B:
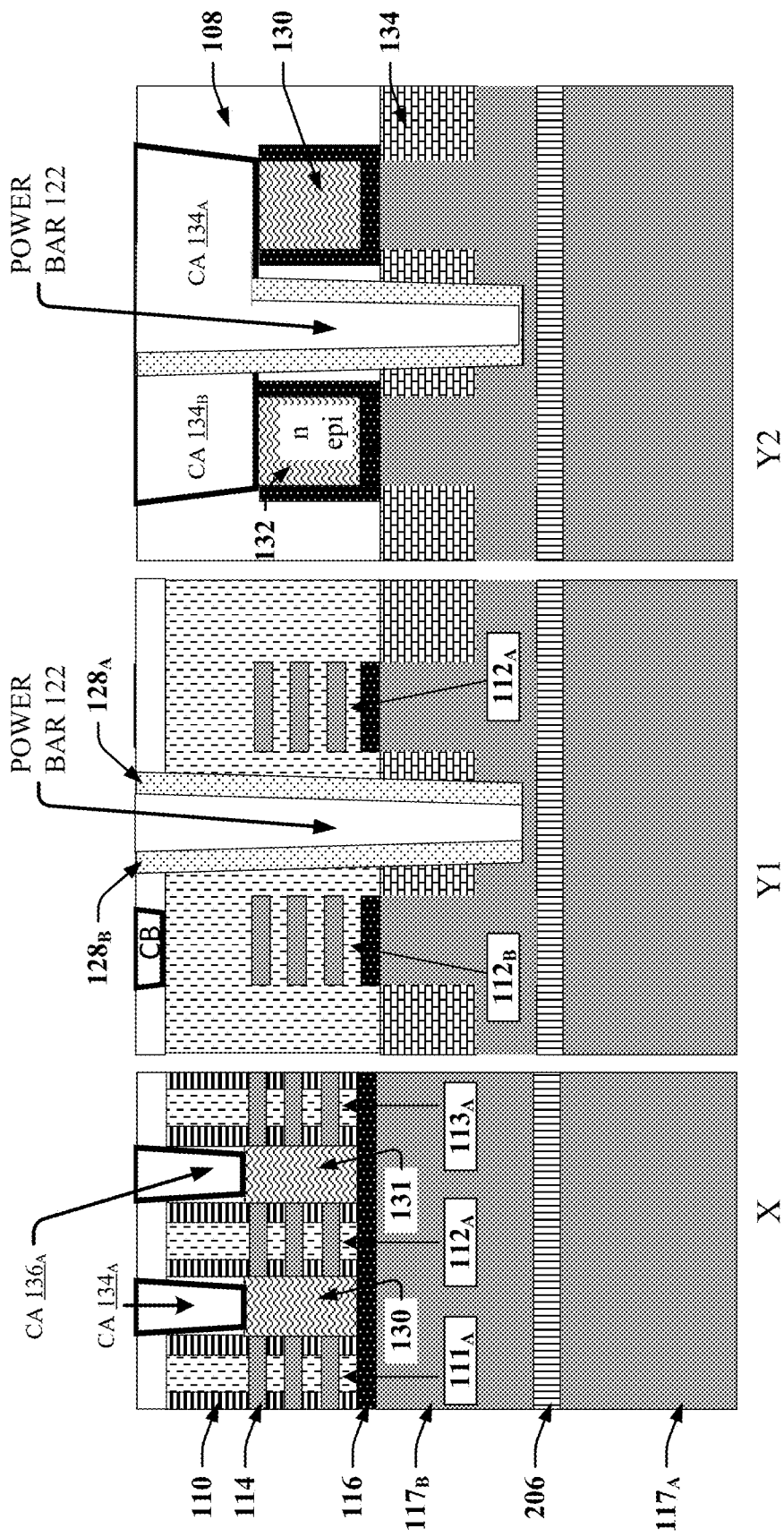
FIG. 10B illustrates example, non-limiting cross-sectional views of a metallization step in a semiconductor device fabrication process in accordance with one or more embodiments described herein.

Top view 1000 illustrates NFET 101, NFET 103, gate $111_A$, gate $112_A$, gate $113_A$, gate $111_B$, gate $112_B$, gate $113_B$, contact CA $134_A$, contact CA $134_B$, contact CA $136_A$, contact CA $136_B$, contact CB, dielectric liner $128_A$, dielectric liner $128_B$, dielectric fill layer and power bar 122, some or all of which are also illustrated in FIG. 10B. Top view 1000 further illustrates locations for cross-sectional views X, Y1 and Y2.

FIG. 10B illustrates example, non-limiting cross-sectional views of a metallization step in a semiconductor device fabrication process in accordance with one or more embodiments described herein. Repetitive description of like elements and/or processes employed in respective embodiments is omitted for sake of brevity.

FIG. 10B illustrates gate spacer and inner spacer 110, Silicon layer 114, BDI layer 116, remaining Si layer $117_B$, Silicon substrate $117_A$ and etch stop layer 206, amongst other layers. Following the VBPR patterning, OPL ashing, metallization, and chemical-mechanical planarization (CMP) can be performed. CMP is a removal process that is used to smooth surfaces. Metallization can be performed by filling the power bar (e.g., power bar 122) region and the contact (e.g., contact CA $134_A$, contact CA $134_B$, contact CA $136_A$, contact CA $136_B$, contact CB) regions with a metal such as, for example, a silicide liner, such as Nickel (Ni), (Titanium) Ti, NiPt, a metal adhesion layer, such as TiN, and low resistance metal fills such as W, Cobalt (Co), or Ruthenium (Ru). After the metallization and in the subsequent process flow steps, it can be observed that contact CA $134_B$ does not connect to BSPR 124 (contact CA $134_B$ can connect to the FEOL region) but contact CA $134_A$ connects to BSPR 124 through power bar 122 by removing the dielectric liner at the region indicated by cut 904 (FIG. 9B). The portion of dielectric liner $128_A$ under contact CA $134_A$ can be preserved. After the metallization, strong capacitance can be generated between the gates (e.g., gate $111_A$, gate $112_A$, gate $113_A$, gate $111_B$, gate $112_B$, gate $113_B$) and power bar 122. For example, power bar 122, gate $112_A$ and dielectric liner $128_A$ can act as a metal-insulator-metal capacitor which can cause parasitic capacitance in the semiconductor device.

Figure 11A:
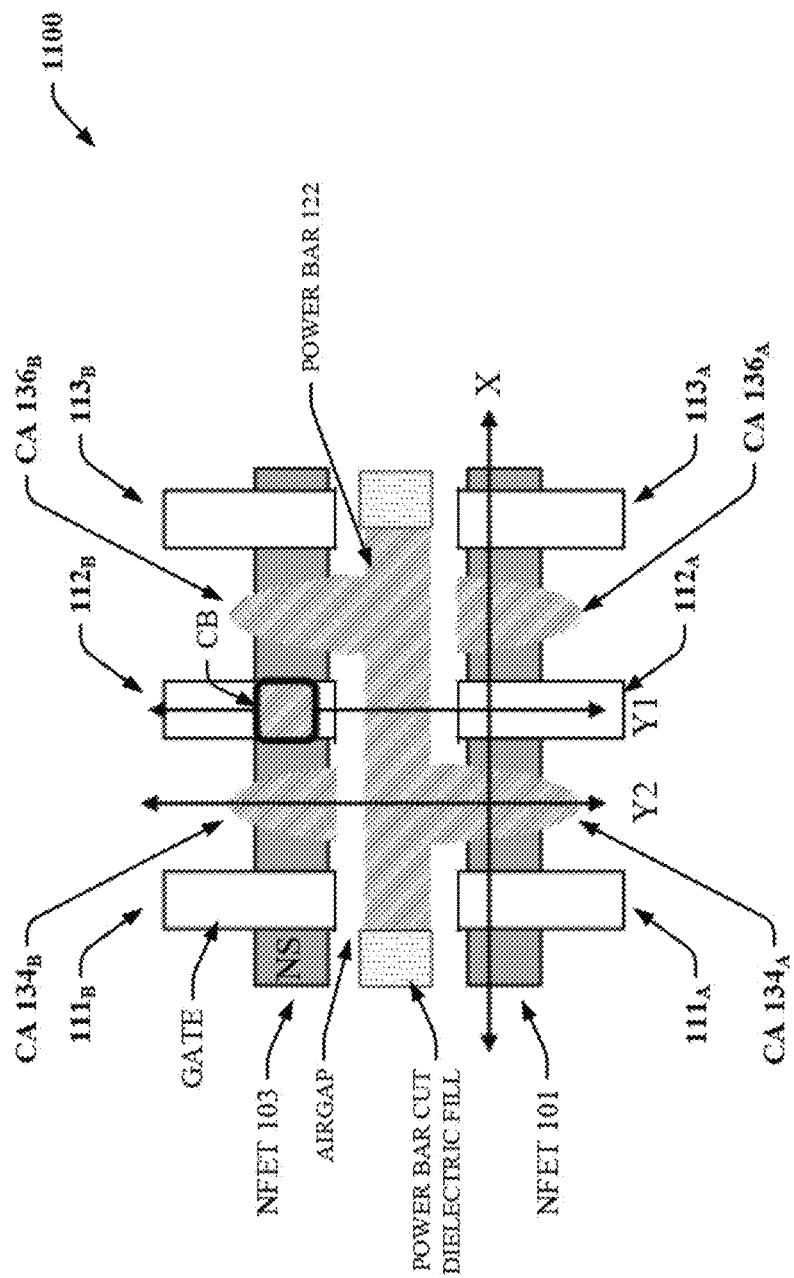
FIG. 11A illustrates an example, non-limiting top view of a step comprising recessing a dielectric liner in a semiconductor device fabrication process in accordance with one or more embodiments described herein.

FIG. 11A illustrates an example, non-limiting top view 1100 of a step comprising recessing a dielectric liner in a semiconductor device fabrication process in accordance with one or more embodiments described herein. Repetitive description of like elements and/or processes employed in respective embodiments is omitted for sake of brevity.

Figure 11B:
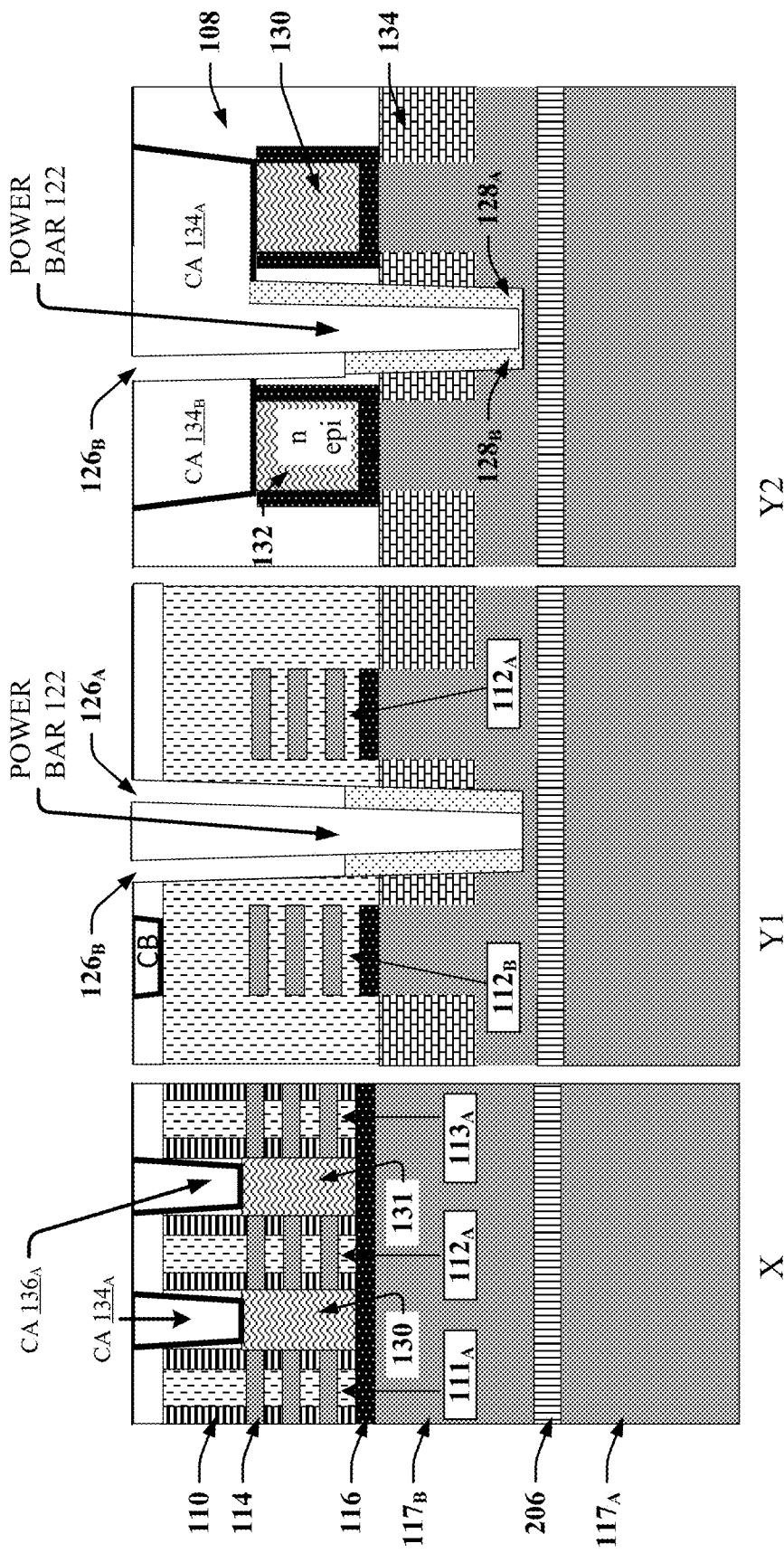
FIG. 11B illustrates example, non-limiting cross-sectional views of a step comprising recessing a dielectric liner in a semiconductor device fabrication process in accordance with one or more embodiments described herein.

Top view 1100 illustrates NFET 101, NFET 103, gate $111_A$, gate $112_A$, gate $113_A$, gate $111_B$, gate $112_B$, gate $113_B$, contact CA $134_A$, contact CA $134_B$, contact CA $136_A$, contact CA $136_B$, contact CB, dielectric fill layer, airgaps and power bar 122, some or all of which are also illustrated in FIG. 11B. Top view 1000 further illustrates locations for cross-sectional views X, Y1 and Y2. It is to be appreciated that although not show, top view 1100 can be illustrative of various layers presented in FIGS. 12-15, not including carrier wafer layer 102, BEOL layer 104 and non-conformal ILD layer 106.

FIG. 1B illustrates example, non-limiting cross-sectional views of a step comprising recessing a dielectric liner in a semiconductor device fabrication process in accordance with one or more embodiments described herein. Repetitive description of like elements and/or processes employed in respective embodiments is omitted for sake of brevity.

FIG. 11B illustrates gate spacer and inner spacer 110, Silicon layer 114, BDI layer 116, remaining Si layer $117_B$, Silicon substrate $117_A$ and etch stop layer 206, amongst other layers. Following the OPL ashing and the metallization, the dielectric liners (e.g., dielectric liner $128_A$ and dielectric liner $128_B$) can be selectively pulled down to create airgaps (e.g., airgap $126_A$ and airgap $126_B$). The airgaps can reduce parasitic capacitance in the semiconductor device, as discussed in one or more embodiments herein. For example, airgap $126_A$ can reduce parasitic capacitance between gate $112_A$ and power bar 122. Similarly, for example, airgap $126_B$ can reduce parasitic capacitance between gate $112_B$ and power bar 122.

As discussed in one or more embodiments herein, the dielectric liners (e.g., dielectric liner $128_A$ and dielectric liner $128_B$) can be selectively pulled down to minimize capacitance in the semiconductor. For example, the dielectric liners (e.g., dielectric liner $128_A$ and dielectric liner $128_B$) can be pulled down to a level that is close to the bottom of the gates (e.g., gate $112_A$, gate $112_B$), as indicated in FIG. 11B. In an embodiment, the dielectric liners (e.g., dielectric liner $128_A$ and dielectric liner $128_B$) can be pulled down to a level that is slightly above or below that level (i.e., slightly above or below a level that is close to the bottom of the gates). Generally, it can be more challenging to recess a dielectric liner further down towards the bottom of a gate (i.e., towards STI layer 134) as compared to recessing the dielectric liner to a level closer to the top of the gate (i.e., towards ILD layer 108). Since STI layer 134 is formed from a dielectric material as well, the dielectric liners (e.g., dielectric liner $128_A$ and dielectric liner $128_B$) do not need to be pulled all the way down.

The advantages of reduced parasitic capacitance can depend on the level to which the dielectric liner is pulled down. An embodiment in which an airgap is formed between power bar 122 and a gate (e.g., gate $112_A$) by recessing a dielectric (e.g., dielectric liner $128_A$) half-way down to the bottom of the gate (e.g., gate $112_A$), has the advantage of partial reduction of parasitic capacitance in the semiconductor device. An embodiment in which an airgap is formed between power bar 122 and a gate (e.g., gate $112_A$) by recessing a dielectric (e.g., dielectric liner $128_A$) all the way down to the bottom of the gate (e.g., gate $112_A$), has the advantage of more than partial reduction of parasitic capacitance in the semiconductor device.

Figure 12:
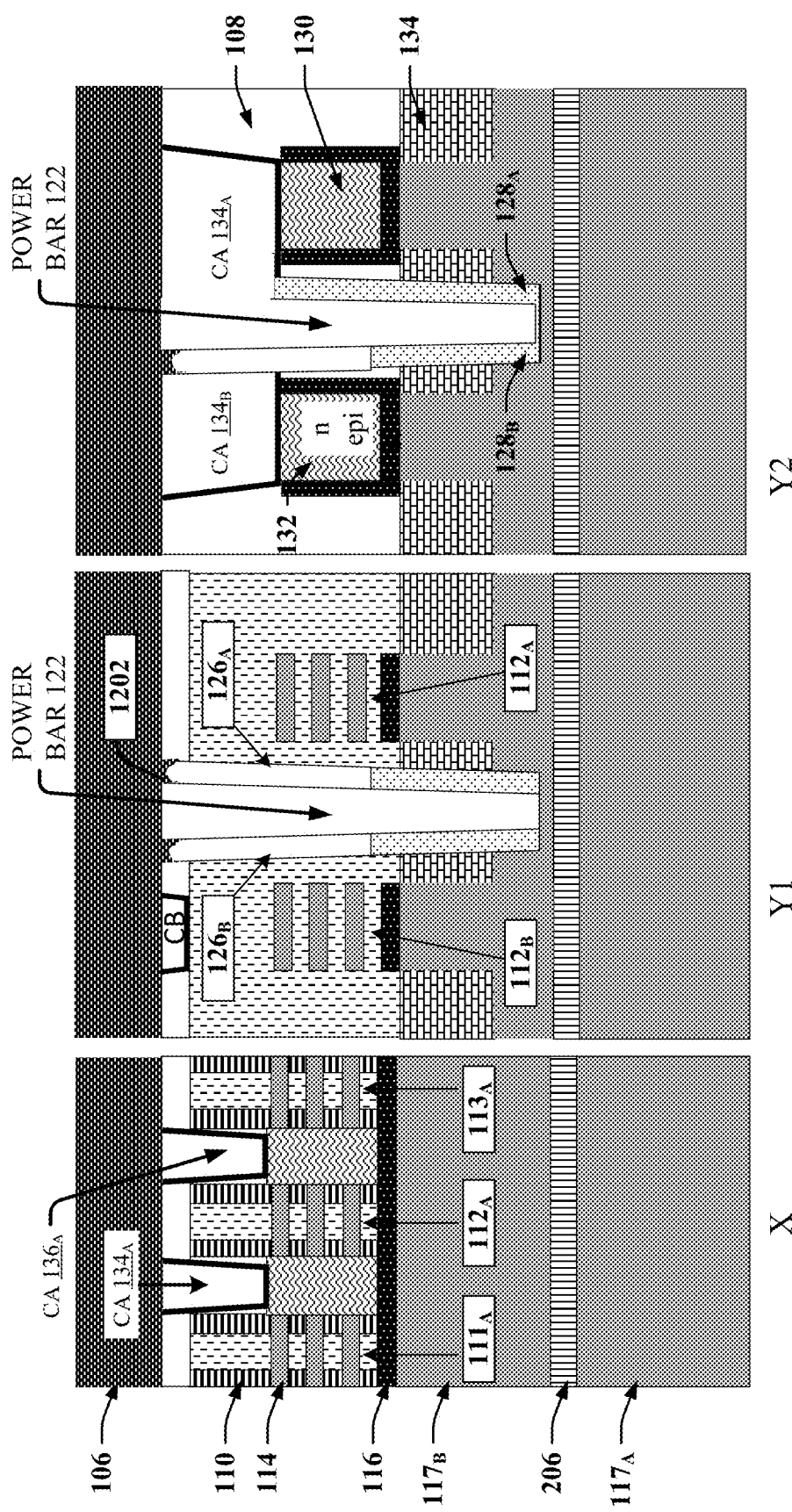
FIG. 12 illustrates example, non-limiting cross-sectional views of a step comprising depositing an interlayer dielectric (ILD) in a semiconductor device fabrication process in accordance with one or more embodiments described herein.

FIG. 12 illustrates example, non-limiting cross-sectional views of a step comprising depositing an ILD in a semiconductor device fabrication process in accordance with one or more embodiments described herein. Repetitive description of like elements and/or processes employed in respective embodiments is omitted for sake of brevity.

FIG. 12 illustrates gate spacer and inner spacer 110, Silicon layer 114, BDI layer 116, remaining Si layer $117_B$, Silicon substrate $117_A$ and etch stop layer 206, amongst other layers. Following the selective pulling down of the dielectric liners (e.g., dielectric liner $128_A$ and dielectric liner $128_B$), non-conformal ILD can be deposited to form non-conformal ILD layer 106 to quickly pinch-off the small gaps (e.g., small gap 1202) between the HKMG (e.g., gate $112_A$) and power bar 122. As such, the airgaps (e.g., airgap $126_A$ and airgap $126_B$) left after deposition of the non-conformal ILD can reduce parasitic capacitance in the semiconductor device, as discussed in one or more embodiments herein.

Figure 13:
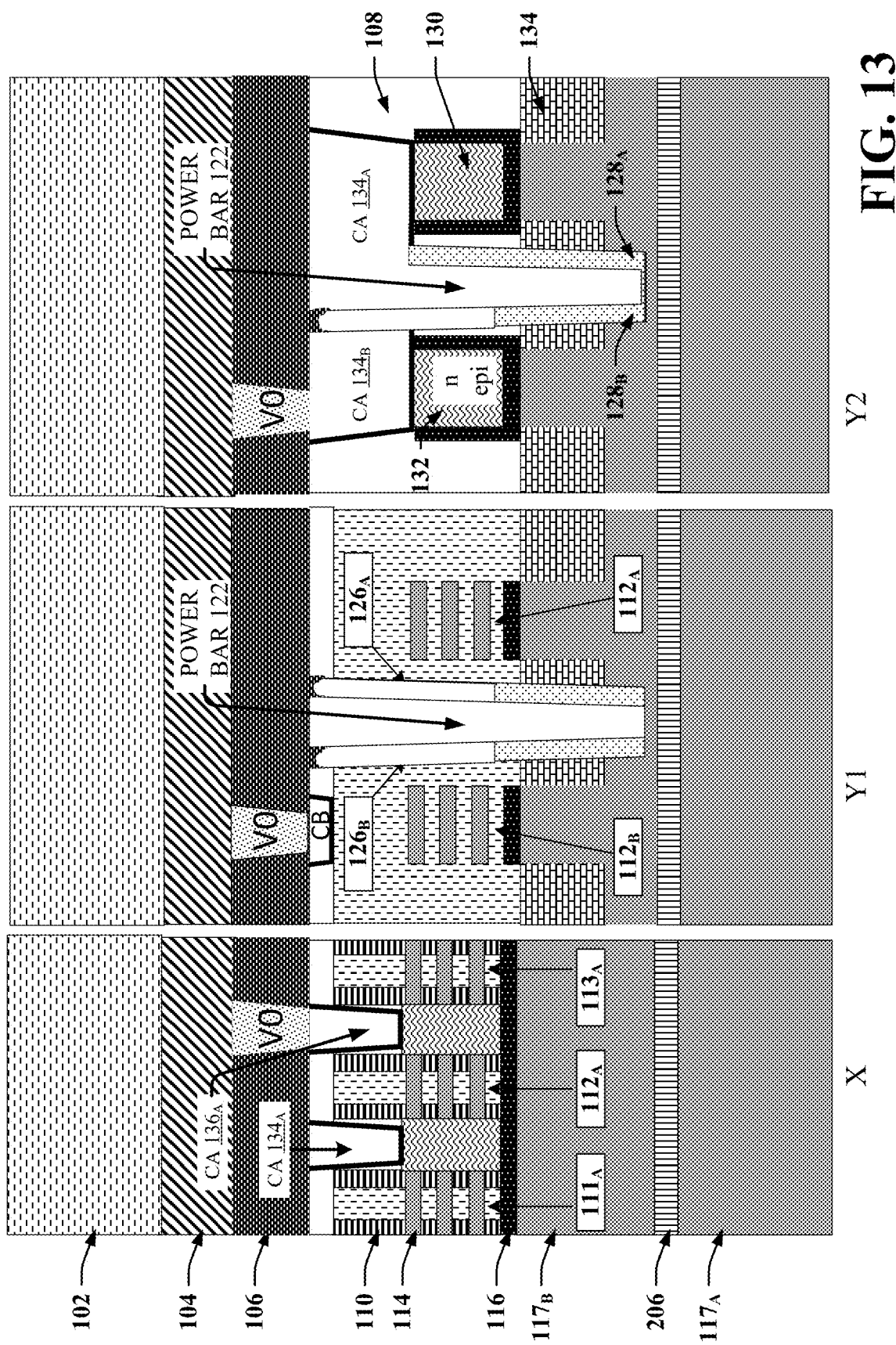
FIG. 13 illustrates example, non-limiting cross-sectional views of a step comprising forming a back-end-of-line (BEOL) device in a semiconductor device fabrication process in accordance with one or more embodiments described herein.

FIG. 13 illustrates example, non-limiting cross-sectional views of a step comprising forming a BEOL device in a semiconductor device fabrication process in accordance with one or more embodiments described herein. Repetitive description of like elements and/or processes employed in respective embodiments is omitted for sake of brevity.

FIG. 13 illustrates gate spacer and inner spacer 110, Silicon layer 114, BDI layer 116, remaining Si layer $117_B$, Silicon substrate $117_A$, non-conformal ILD layer 106, and etch stop layer 206, amongst other layers. Following the deposition of non-conformal ILD layer 106, vias can be formed. The vias are illustrated in FIG. 13 as 'V0' in the cross-sectional views X, Y1 and Y2. Thereafter, BEOL layer 104 can be formed and the carrier wafer layer 102 can be bonded to BEOL layer 104.

Figure 14:
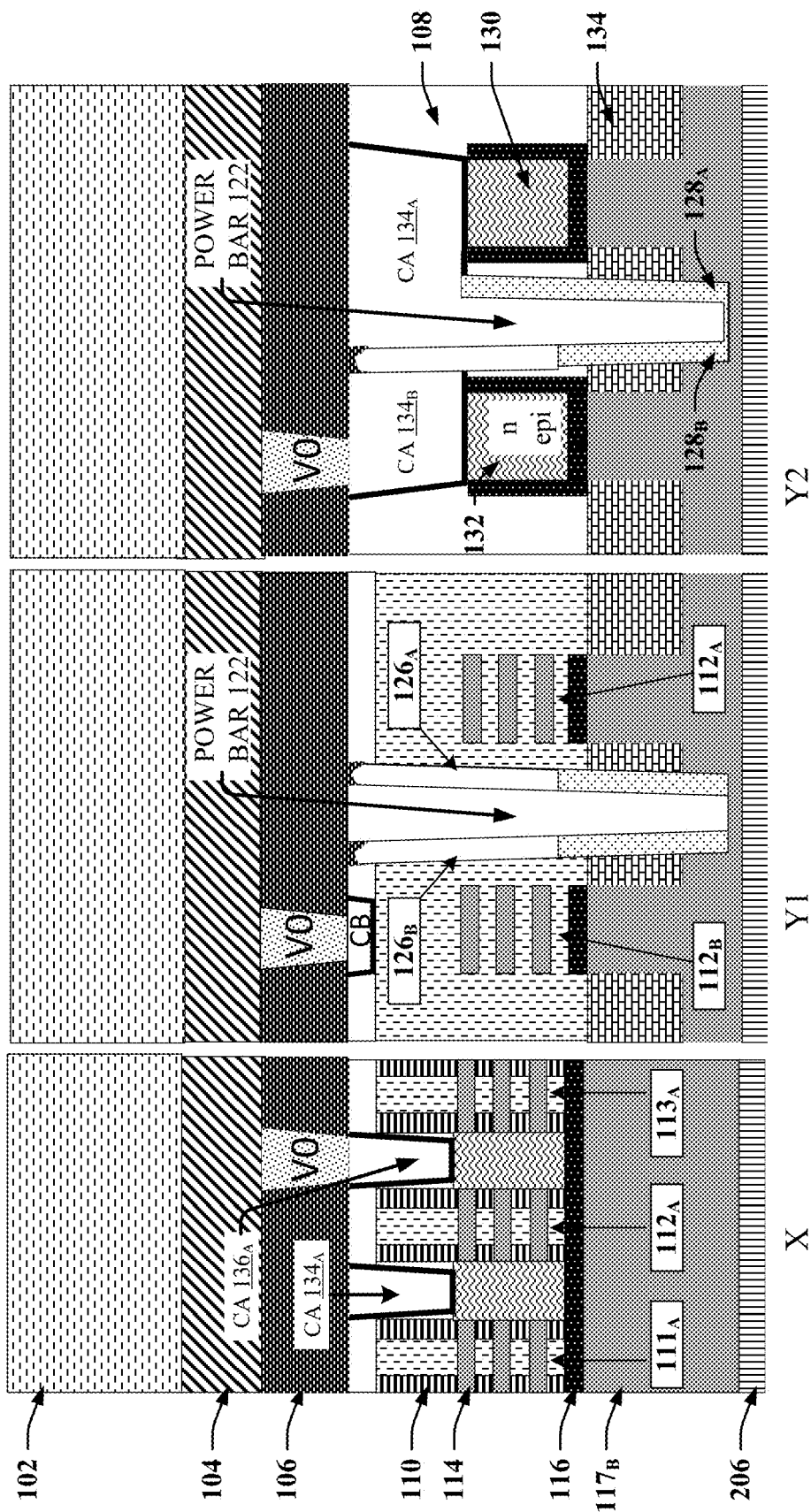
FIG. 14 illustrates example, non-limiting cross-sectional views of a step comprising removing substrate in a semiconductor device fabrication process in accordance with one or more embodiments described herein.

FIG. 14 illustrates example, non-limiting cross-sectional views of a step comprising removing substrate in a semiconductor device fabrication process in accordance with one or more embodiments described herein. Repetitive description of like elements and/or processes employed in respective embodiments is omitted for sake of brevity.

FIG. 14 illustrates gate spacer and inner spacer 110, Silicon layer 114, BDI layer 116, remaining Si layer $117_B$, non-conformal ILD layer 106, and etch stop layer 206, amongst other layers. Following the formation of BEOL layer 104 and carrier wafer layer 102, a wafer can be flipped for backside processing, and Silicon substrate $117_A$ can be removed, stopping on etch stop layer 206, as illustrated in FIG. 14.

FIG. 15 illustrates example, non-limiting cross-sectional views of a step comprising recessing a Silicon layer in a semiconductor device fabrication process in accordance with one or more embodiments described herein. Repetitive description of like elements and/or processes employed in respective embodiments is omitted for sake of brevity.

FIG. 15 illustrates gate spacer and inner spacer 110, Silicon layer 114, BDI layer 116, remaining Si layer $117_B$, and non-conformal ILD layer 106, amongst other layers. Following the removal of Silicon substrate $117_A$, etch stop layer 206 can be removed and remaining Si layer $117_B$ can be recessed as indicated in FIG. 15. Thereafter, BILD, BSPR and BSPDN can be formed as illustrated in the final structure in FIG. 1B. The BILD, BSPR and BSPDN are respectively illustrated in FIG. 1B as BILD layer 118, BSPR 124 and BSPDN layer 120.

Figure 16:
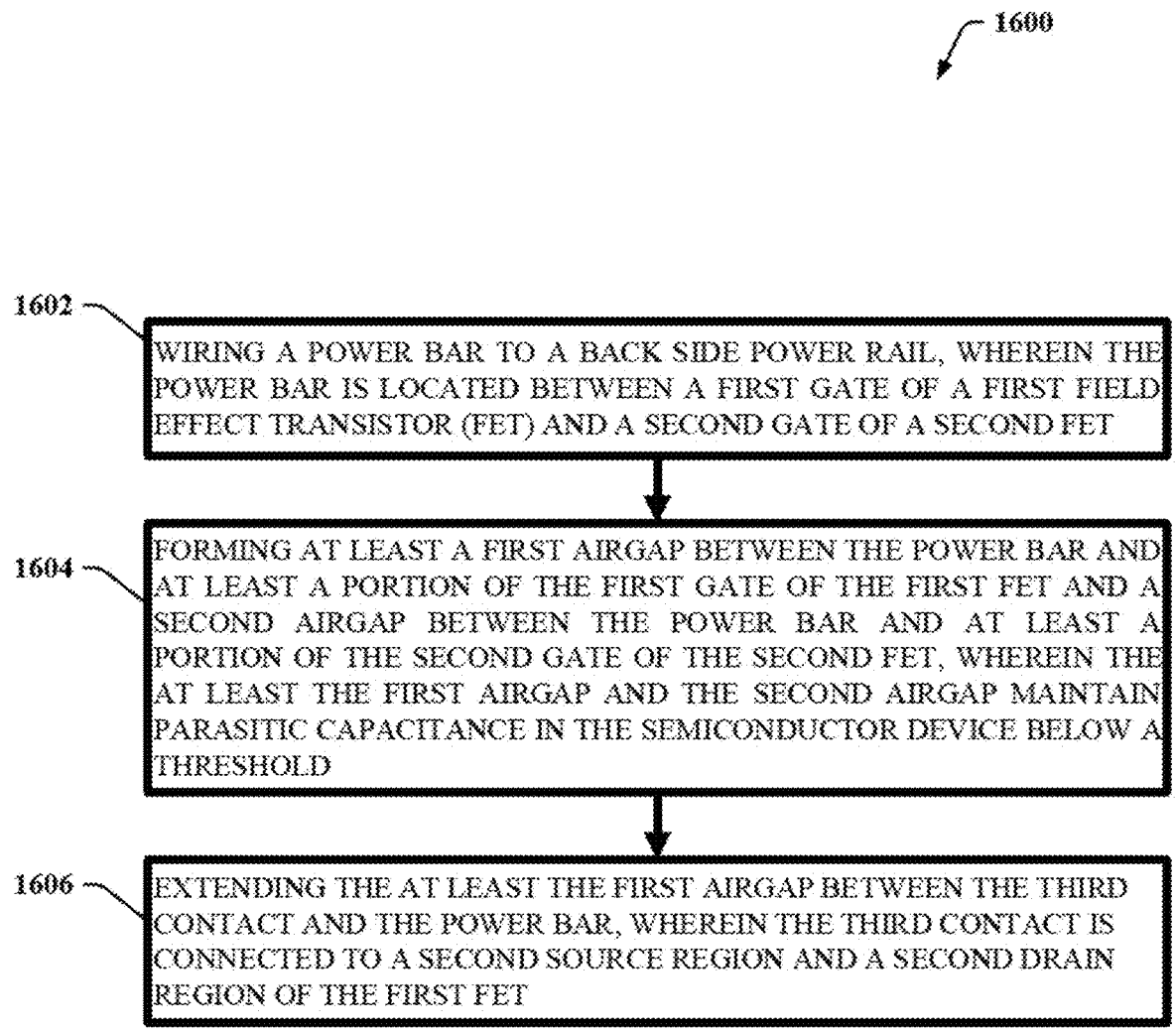
FIG. 16 illustrates a flow diagram of an example, non-limiting method in accordance with one or more embodiments described herein.

FIG. 16 illustrates a flow diagram of an example, non-limiting method 1600 in accordance with one or more embodiments described herein. Repetitive description of like elements and/or processes employed in respective embodiments is omitted for sake of brevity.

At 1602, the non-limiting method 1600 can comprise wiring a power bar to a backside power rail, wherein the power bar is located between a first gate of a first field effect transistor (FET) and a second gate of a second FET.

At 1604, the non-limiting method 1600 can comprise forming at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold.

At 1606, the non-limiting method 1600 can comprise extending the at least the first airgap between the third contact and the power bar, wherein the third contact is connected to a second source region and a second drain region of the first FET.

Figure 17:
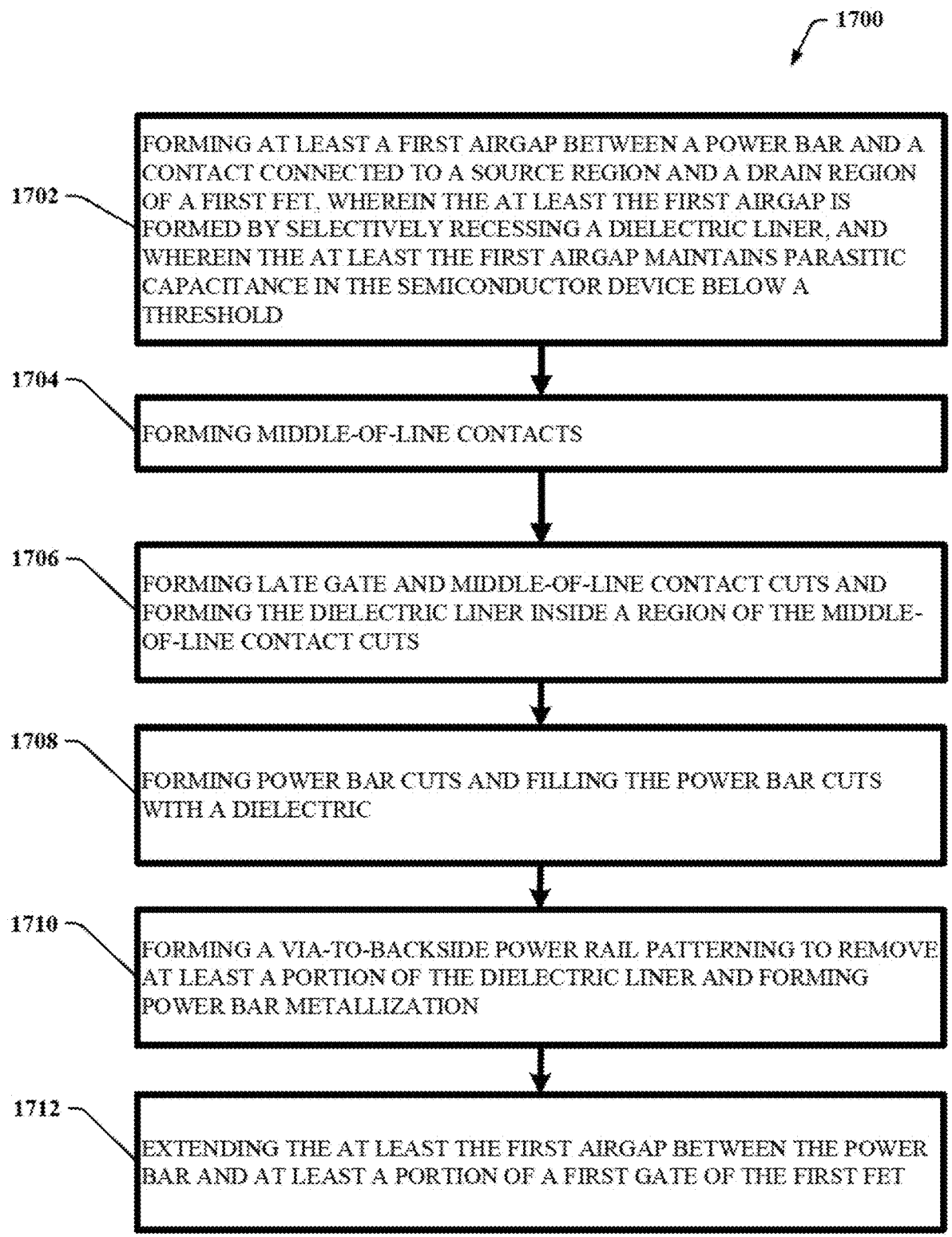
FIG. 17 illustrates another flow diagram of an example, non-limiting method in accordance with one or more embodiments described herein.

FIG. 17 illustrates another flow diagram of an example, non-limiting method 1700 in accordance with one or more embodiments described herein. Repetitive description of like elements and/or processes employed in respective embodiments is omitted for sake of brevity.

At 1702, the non-limiting method 1700 can comprise forming at least a first airgap between a power bar and a contact connected to a source region and a drain region of a first FET, wherein the at least the first airgap is formed by selectively recessing a dielectric liner, and wherein the at least the first airgap maintains parasitic capacitance in the semiconductor device below a threshold.

At 1704, the non-limiting method 1700 can comprise forming MOL contacts.

At 1706, the non-limiting method 1700 can comprise forming late gate and MOL contact cuts and forming the dielectric liner inside a region of the MOL contact cuts.

At 1708, the non-limiting method 1700 can comprise forming power bar cuts and filling the power bar cuts with a dielectric.

At 1710, the non-limiting method 1700 can comprise forming a VBPR patterning to remove at least a portion of the dielectric liner and forming power bar metallization.

At 1712, the non-limiting method 1700 can comprise extending the at least the first airgap between the power bar and at least a portion of a first gate of the first FET.

Figure 18:
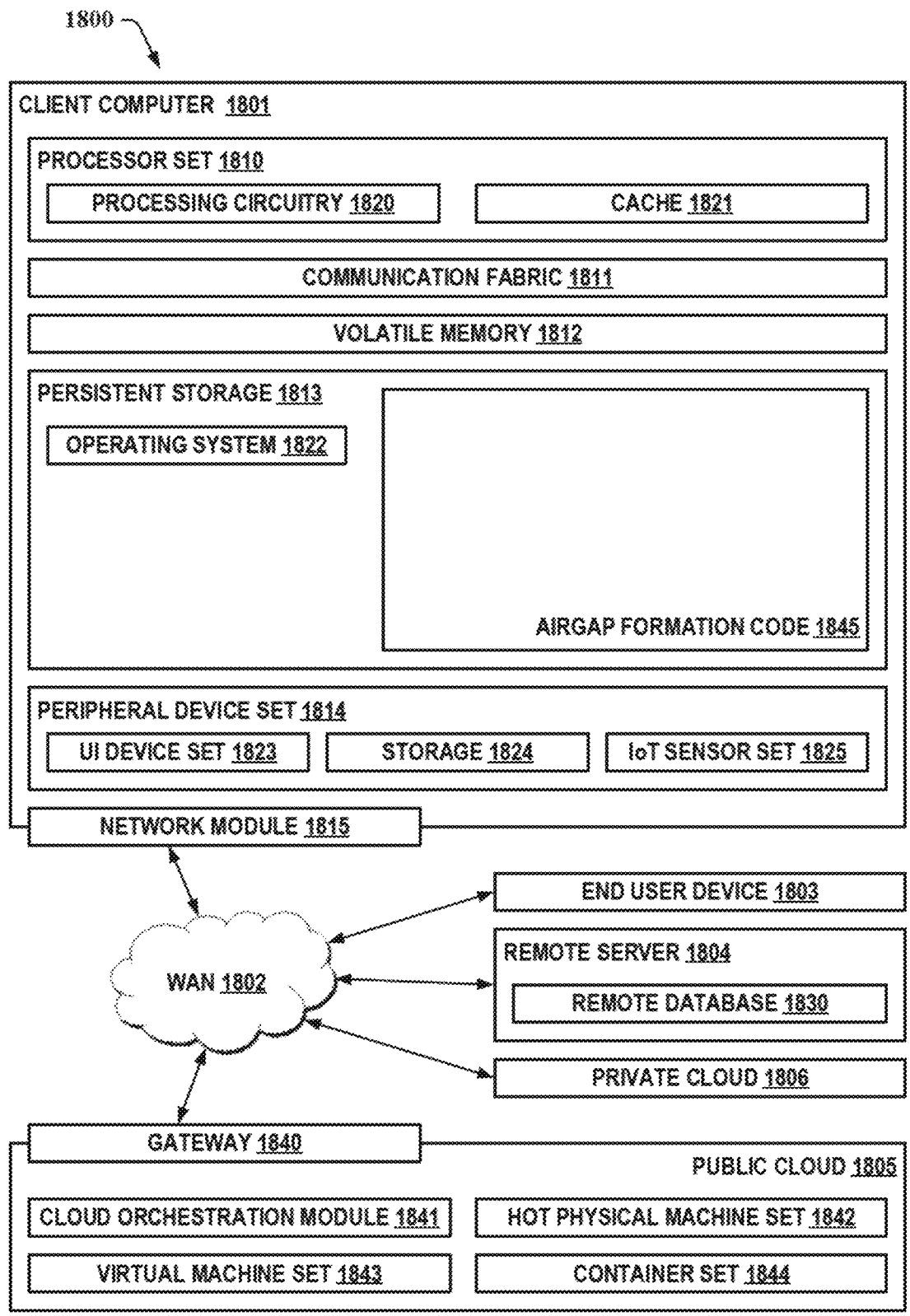
FIG. 18 illustrates a block diagram of an example, non-limiting operating environment in which one or more embodiments described herein can be facilitated.

FIG. 18 illustrates a block diagram of an example, non-limiting, operating environment in which one or more embodiments described herein can be facilitated. FIG. 18 and the following discussion are intended to provide a general description of a suitable operating environment 1800 in which one or more embodiments described herein at FIGS. 1-17 can be implemented.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1800 contains an example of an environment for the execution of at least some of the computer code involved in performing the inventive methods, such as airgap formation code 1845. In addition to block 1845, computing environment 1800 includes, for example, computer 1801, wide area network (WAN) 1802, end user device (EUD) 1803, remote server 1804, public cloud 1805, and private cloud 1806. In this embodiment, computer 1801 includes processor set 1810 (including processing circuitry 1820 and cache 1821), communication fabric 1811, volatile memory 1812, persistent storage 1813 (including operating system 1822 and block 1845, as identified above), peripheral device set 1814 (including user interface (UI), device set 1823, storage 1824, and Internet of Things (IoT) sensor set 1825), and network module 1815. Remote server 1804 includes remote database 1830. Public cloud 1805 includes gateway 1840, cloud orchestration module 1841, host physical machine set 1842, virtual machine set 1843, and container set 1844.

COMPUTER 1801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1830. As is well understood in the art of computer technology, and depending upon the technology, performance of a computer-implemented method may be distributed among multiple computers and/or between multiple locations. On the other hand, in this presentation of computing environment 1800, detailed discussion is focused on a single computer, specifically computer 1801, to keep the presentation as simple as possible. Computer 1801 may be located in a cloud, even though it is not shown in a cloud in FIG. 18. On the other hand, computer 1801 is not required to be in a cloud except to any extent as may be affirmatively indicated.

PROCESSOR SET 1810 includes one, or more, computer processors of any type now known or to be developed in the future. Processing circuitry 1820 may be distributed over multiple packages, for example, multiple, coordinated integrated circuit chips. Processing circuitry 1820 may implement multiple processor threads and/or multiple processor cores. Cache 1821 is memory that is located in the processor chip package(s) and is typically used for data or code that should be available for rapid access by the threads or cores running on processor set 1810. Cache memories are typically organized into multiple levels depending upon relative proximity to the processing circuitry. Alternatively, some, or all, of the cache for the processor set may be located "off chip." In some computing environments, processor set 1810 may be designed for working with qubits and performing quantum computing.

Computer readable program instructions are typically loaded onto computer 1801 to cause a series of operational steps to be performed by processor set 1810 of computer 1801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1821 and the other storage media discussed below. The program instructions, and associated data, are accessed by processor set 1810 to control and direct performance of the inventive methods. In computing environment 1800, at least some of the instructions for performing the inventive methods may be stored in block 1845 in persistent storage 1813.

COMMUNICATION FABRIC 1811 is the signal conduction paths that allow the various components of computer 1801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1812 is any type of volatile memory now known or to be developed in the future. Examples include dynamic type random access memory (RAM) or static type RAM. Typically, the volatile memory is characterized by random access, but this is not required unless affirmatively indicated. In computer 1801, the volatile memory 1812 is located in a single package and is internal to computer 1801, but, alternatively or additionally, the volatile memory may be distributed over multiple packages and/or located externally with respect to computer 1801.

PERSISTENT STORAGE 1813 is any form of non-volatile storage for computers that is now known or to be developed in the future. The non-volatility of this storage means that the stored data is maintained regardless of whether power is being supplied to computer 1801 and/or directly to persistent storage 1813. Persistent storage 1813 may be a read only memory (ROM), but typically at least a portion of the persistent storage allows writing of data, deletion of data and re-writing of data. Some familiar forms of persistent storage include magnetic disks and solid state storage devices. Operating system 1822 may take several forms, such as various known proprietary operating systems or open source Portable Operating System Interface type operating systems that employ a kernel. The code included in block 1845 typically includes at least some of the computer code involved in performing the inventive methods.

PERIPHERAL DEVICE SET 1814 includes the set of peripheral devices of computer 1801. Data communication connections between the peripheral devices and the other components of computer 1801 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1823 may include components such as a display screen, speaker, microphone, wearable devices (such as goggles and smart watches), keyboard, mouse, printer, touchpad, game controllers, and haptic devices. Storage 1824 is external storage, such as an external hard drive, or insertable storage, such as an SD card. Storage 1824 may be persistent and/or volatile. In some embodiments, storage 1824 may take the form of a quantum computing storage device for storing data in the form of qubits. In embodiments where computer 1801 is required to have a large amount of storage (for example, where computer 1801 locally stores and manages a large database) then this storage may be provided by peripheral storage devices designed for storing very large amounts of data, such as a storage area network (SAN) that is shared by multiple, geographically distributed computers. IoT sensor set 1825 is made up of sensors that can be used in Internet of Things applications. For example, one sensor may be a thermometer and another sensor may be a motion detector.

NETWORK MODULE 1815 is the collection of computer software, hardware, and firmware that allows computer 1801 to communicate with other computers through WAN 1802. Network module 1815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1815 are performed on the same physical hardware device. In other embodiments (for example, embodiments that utilize software-defined networking (SDN)), the control functions and the forwarding functions of network module 1815 are performed on physically separate devices, such that the control functions manage several different network hardware devices. Computer readable program instructions for performing the inventive methods can typically be downloaded to computer 1801 from an external computer or external storage device through a network adapter card or network interface included in network module 1815.

WAN 1802 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1803 is any computer system that is used and controlled by an end user (for example, a customer of an enterprise that operates computer 1801), and may take any of the forms discussed above in connection with computer 1801. EUD 1803 typically receives helpful and useful data from the operations of computer 1801. For example, in a hypothetical case where computer 1801 is designed to provide a recommendation to an end user, this recommendation would typically be communicated from network module 1815 of computer 1801 through WAN 1802 to EUD 1803. In this way, EUD 1803 can display, or otherwise present, the recommendation to an end user. In some embodiments, EUD 1803 may be a client device, such as thin client, heavy client, mainframe computer, desktop computer and so on.

REMOTE SERVER 1804 is any computer system that serves at least some data and/or functionality to computer 1801. Remote server 1804 may be controlled and used by the same entity that operates computer 1801. Remote server 1804 represents the machine(s) that collect and store helpful and useful data for use by other computers, such as computer 1801. For example, in a hypothetical case where computer 1801 is designed and programmed to provide a recommendation based on historical data, then this historical data may be provided to computer 1801 from remote database 1830 of remote server 1804.

PUBLIC CLOUD 1805 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1805 is performed by the computer hardware and/or software of cloud orchestration module 1841. The computing resources provided by public cloud 1805 are typically implemented by virtual computing environments that run on various computers making up the computers of host physical machine set 1842, which is the universe of physical computers in and/or available to public cloud 1805. The virtual computing environments (VCEs) typically take the form of virtual machines from virtual machine set 1843 and/or containers from container set 1844. It is understood that these VCEs may be stored as images and may be transferred among and between the various physical machine hosts, either as images or after instantiation of the VCE. Cloud orchestration module 1841 manages the transfer and storage of images, deploys new instantiations of VCEs and manages active instantiations of VCE deployments. Gateway 1840 is the collection of computer software, hardware, and firmware that allows public cloud 1805 to communicate through WAN 1802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1806 is similar to public cloud 1805, except that the computing resources are only available for use by a single enterprise. While private cloud 1806 is depicted as being in communication with WAN 1802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1805 and private cloud 1806 are both part of a larger hybrid cloud.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a power bar wired to a backside power rail, wherein the power bar is located between a first gate of a first field effect transistor (FET) and a second gate of a second FET; and
   at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold, wherein a third contact is connected to a second source region and a second drain region of the first FET, and wherein the at least the first airgap extends between the third contact and the power bar.

2. The semiconductor device of claim 1, wherein the first FET comprises a first source region and a first drain region, wherein the first source region and the first drain region are connected to a first contact on a frontside of the first FET, and wherein a dielectric liner is present under the first contact such that an airgap is absent under the first contact.

3. The semiconductor device of claim 1, wherein the second FET comprises a second source region and a second drain region, wherein the second source region and the second drain region are connected to a second contact on a frontside of the second FET.

4. The semiconductor device of claim 1, further comprising:
   a backside power delivery network on a backside of the first FET and the second FET, wherein the backside power delivery network is connected to the power bar via the backside power rail.

5. The semiconductor device of claim 1, wherein the power bar is located on a frontside of the first FET and the second FET.

6. The semiconductor device of claim 1, wherein a dielectric liner is present under the at least the first airgap and the second airgap.

7. A method for fabricating a semiconductor device, comprising:
   wiring a power bar to a backside power rail, wherein the power bar is located between a first gate of a first FET and a second gate of a second FET; and
   forming at least a first airgap between the power bar and at least a portion of the first gate of the first FET and a second airgap between the power bar and at least a portion of the second gate of the second FET, wherein the at least the first airgap and the second airgap maintain parasitic capacitance in the semiconductor device below a threshold, wherein a third contact is connected to a second source region and a second drain region of the first FET, and wherein the at least the first airgap extends between the third contact and the power bar.

8. The method of claim 7, wherein the first FET comprises a first source region and a first drain region, wherein the first source region and the first drain region are connected to a first contact on a frontside of the first FET, and wherein a dielectric liner is present under the first contact such that an airgap is absent under the first contact.

9. The method of claim 7, wherein the second FET comprises a second source region and a second drain region, wherein the second source region and the second drain region are connected to a second contact on a frontside of the second FET.

10. The method of claim 7, wherein a backside power delivery network is connected to the power bar via the backside power rail, wherein the backside power delivery network is located on a backside of the first FET and the second FET.

11. The method of claim 7, wherein the power bar is located on a frontside of the first FET and the second FET.

12. The method of claim 7, wherein a dielectric liner is present under the at least the first airgap and the second airgap.

13. A method for fabricating a semiconductor device, the method comprising:
  forming at least a first airgap between a power bar and a contact connected to a source region and a drain region of a first FET, wherein the at least the first airgap is formed by selectively recessing a dielectric liner, and wherein the at least the first airgap maintains parasitic capacitance in the semiconductor device below a threshold; and
  forming middle-of-line contacts.

14. The method of claim 13, further comprising:
  forming late gate and middle-of-line contact cuts and forming the dielectric liner inside a region of the middle-of-line contact cuts.

15. The method of claim 13, further comprising:
  forming power bar cuts and filling the power bar cuts with a dielectric.

16. The method of claim 13, further comprising:
  forming a via-to-backside power rail patterning to remove at least a portion of the dielectric liner and forming power bar metallization.

17. The method of claim 13, wherein the at least the first airgap extends between the power bar and at least a portion of a first gate of the first FET and wherein the semiconductor device comprises a second airgap between the power bar and at least a portion of a second gate of a second FET.

* * * * *